US011251299B2

(12) United States Patent
Tanaka et al.

(10) Patent No.: US 11,251,299 B2
(45) Date of Patent: Feb. 15, 2022

(54) SILICON CARBIDE SEMICONDUCTOR DEVICE AND MANUFACTURING METHOD OF SAME

(71) Applicant: Mitsubishi Electric Corporation, Tokyo (JP)

(72) Inventors: Rina Tanaka, Tokyo (JP); Katsutoshi Sugawara, Tokyo (JP); Yutaka Fukui, Tokyo (JP); Hideyuki Hatta, Tokyo (JP); Yusuke Miyata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 56 days.

(21) Appl. No.: 16/967,730

(22) PCT Filed: Mar. 28, 2018

(86) PCT No.: PCT/JP2018/012836
§ 371 (c)(1),
(2) Date: Aug. 6, 2020

(87) PCT Pub. No.: WO2019/186785
PCT Pub. Date: Oct. 3, 2019

(65) Prior Publication Data
US 2021/0043765 A1 Feb. 11, 2021

(51) Int. Cl.
*H01L 21/04* (2006.01)
*H01L 29/78* (2006.01)
(Continued)

(52) U.S. Cl.
CPC ...... *H01L 29/7813* (2013.01); *H01L 29/1095* (2013.01); *H01L 29/1608* (2013.01)

(58) Field of Classification Search
CPC ....... H01L 21/04; H01L 21/047; H01L 29/06; H01L 29/0623; H01L 29/08;
(Continued)

(56) References Cited

U.S. PATENT DOCUMENTS

2009/0114969 A1  5/2009  Suzuki et al.
2016/0247910 A1  8/2016  Suzuki et al.
(Continued)

FOREIGN PATENT DOCUMENTS

| JP | 2009-117593 A | 5/2009 |
| JP | 2015-072999 A | 4/2015 |
| WO | 2016/002766 A1 | 1/2016 |

OTHER PUBLICATIONS

International Search Report and Written Opinion dated May 22, 2018 for PCT/JP2018/012836 filed on Mar. 28, 2018, 8 pages including English Translation of the International Search Report.

*Primary Examiner* — Fazli Erdem
(74) *Attorney, Agent, or Firm* — Xsensus LLP

(57) ABSTRACT

A drift layer made of silicon carbide has a first conductivity type. A body region on the drift layer has a second conductivity type. A source region on the body region has the first conductivity type. A gate insulating film is on each inner wall of at least one trench. A protective layer has at least a portion below the trench, is in contact with the drift layer, and has the second conductivity type. A first low-resistance layer is in contact with the trench and the protective layer, straddles a border between the trench and the protective layer in the depth direction, has the first conductivity type, and has a higher impurity concentration than the drift layer. A second low-resistance layer is in contact with the first low-resistance layer, is away from the trench, has the first conductivity type, and has a higher impurity concentration than the first low-resistance layer.

15 Claims, 16 Drawing Sheets

(51) Int. Cl.
   *H01L 29/66*    (2006.01)
   *H01L 29/10*    (2006.01)
   *H01L 29/16*    (2006.01)

(58) Field of Classification Search
   CPC . H01L 29/0878; H01L 29/10; H01L 29/1095;
       H01L 29/16; H01L 29/1608; H01L 29/42;
       H01L 29/4236; H01L 29/66; H01L
       29/66068; H01L 29/78; H01L 29/7802;
       H01L 29/7813
   USPC ............................................................ 257/330
   See application file for complete search history.

(56) References Cited

U.S. PATENT DOCUMENTS

| | | | |
|---|---|---|---|
| 2017/0141186 A1 | 5/2017 | Shiomi | |
| 2017/0309711 A1* | 10/2017 | Kagawa | H01L 21/02532 |
| 2019/0206987 A1* | 7/2019 | Adachi | H02M 1/08 |
| 2020/0194554 A1* | 6/2020 | Adachi | H01L 29/7811 |
| 2020/0381253 A1* | 12/2020 | Schulze | H01L 29/1095 |
| 2021/0288156 A1* | 9/2021 | Fukui | H01L 29/1608 |

* cited by examiner

F I G. 1
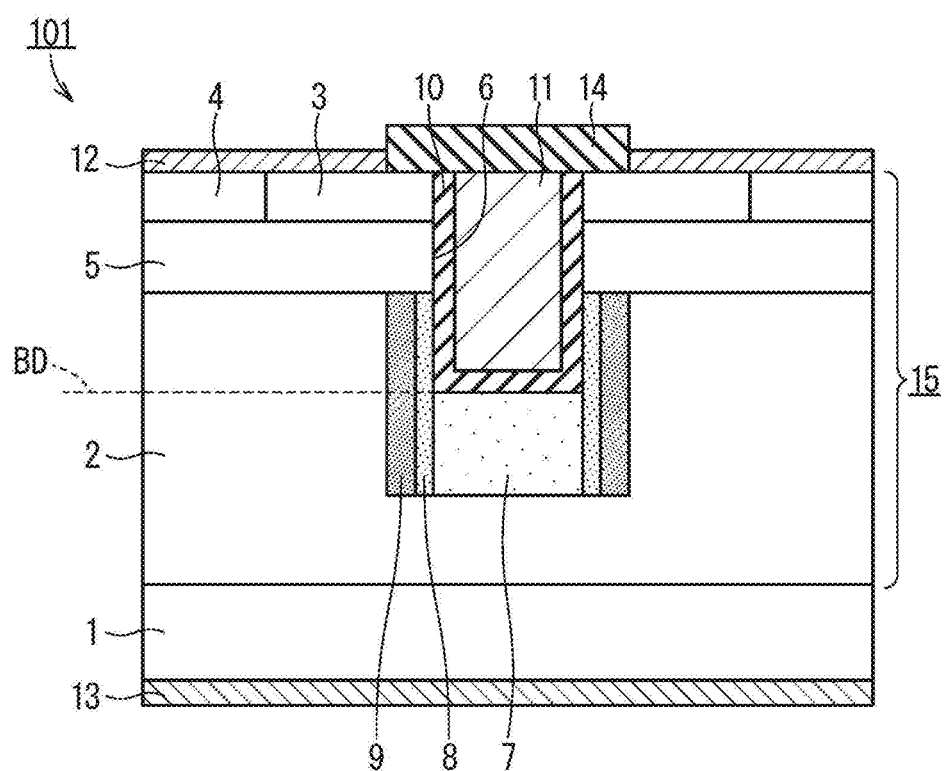

(EXAMPLE)

F I G. 1 8
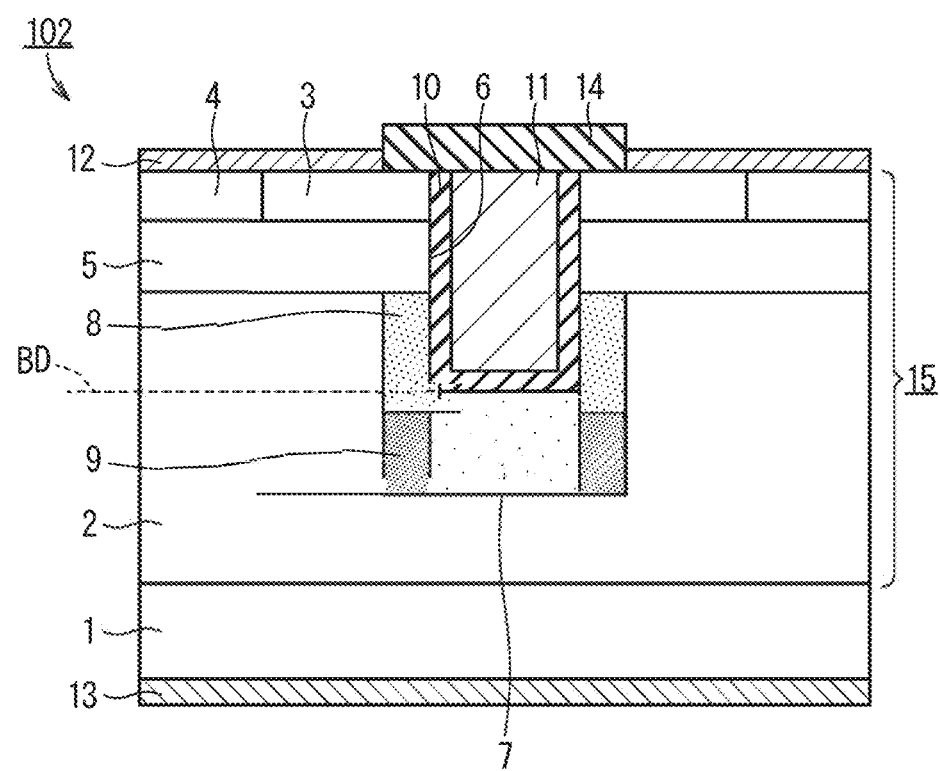

F I G. 25
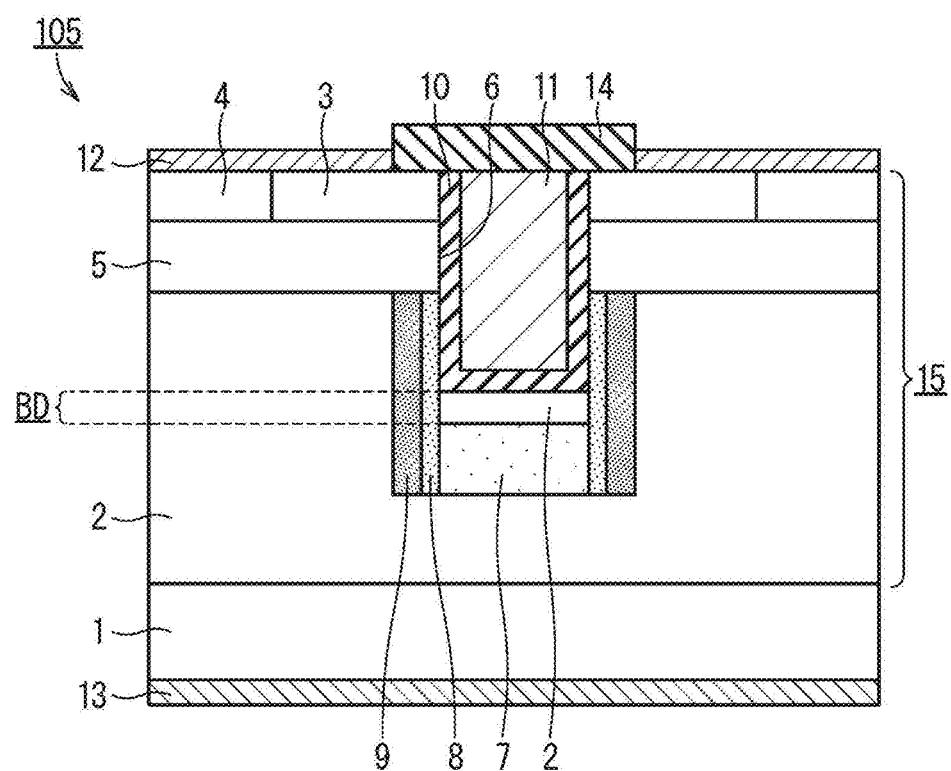

SILICON CARBIDE SEMICONDUCTOR DEVICE AND MANUFACTURING METHOD OF SAME

CROSS-REFERENCE TO RELATED APPLICATION

The present application is based on PCT filing PCT/JP2018/012836, filed Mar. 28, 2018, the entire contents of which are incorporated herein by reference.

TECHNICAL FIELD

The present invention relates to a silicon carbide semiconductor device having a trench gate and a manufacturing method of the same.

BACKGROUND ART

As power switching elements, insulated gate semiconductor devices, such as metal oxide semiconductor field effect transistors (MOSFETs) and insulated gate bipolar transistors (IGBTs), are widely used. The on-state of an insulated gate semiconductor device is obtained by forming a channel in a body region by applying a voltage higher than or equal to a threshold voltage to a gate electrode. Among such insulated gate semiconductor devices, a trench gate type has a trench reaching a drift layer from the surface of a semiconductor layer, and the body region of the side surface of the trench is used as the channel. With this channel structure, a channel width density can be improved. Therefore, a cell pitch can be reduced, whereby device performance can be improved.

On the other hand, as next-generation semiconductor devices capable of achieving high breakdown voltage and low loss, semiconductor devices using silicon carbide (SiC) as a semiconductor material (hereinafter, referred to as "silicon carbide semiconductor devices") have been attracting attention, and trench gate silicon carbide semiconductor devices are also being developed. In the trench gate semiconductor devices, there is a problem that electric field concentration occurs at the bottom of the trench when a high voltage is applied in an off-state of the semiconductor device. In particular, in the trench gate silicon carbide semiconductor devices, SiC has high dielectric breakdown strength, and hence gate insulating film breakdown, due to the electric field concentration at the bottom of the trench, is likely to occur before avalanche breakdown in the drift layer. Therefore, in the trench gate silicon carbide semiconductor devices, the electric field concentration at the bottom of the trench is likely to be a problem.

So, in order to relax the electric field concentration at the bottom of the trench, it is proposed to provide a protective layer of a conductivity type, different from the conductivity type of the drift layer, at the bottom of the trench. The electric field concentration at the bottom of the trench can be relaxed by providing the protective layer. In such a structure, however, there is a problem that a junction field effect transistor (JFET) resistance to a current flowing through the drift layer increases. Specifically, narrowing of a current path between regions having a conductivity type opposite to the conductivity type of the drift layer, such as between the adjacent protective layers or between the protective layer and a body region, becomes a problem. Therefore, when normal dimension design is performed while an increase in the JFET resistance is being avoided, a trench depth that determines the distance between the protective layer and the body region that are adjacent in the depth direction, and a cell pitch that determines the distance between the protective layers that are adjacent in the in-plane direction, cannot be reduced. Therefore, it becomes difficult to improve device performance from viewpoints other than the JFET resistance. Therefore, a structure suitable for suppressing the JFET resistance, rather than just dimension adjustment, is required.

As the structure for suppressing the JFET resistance caused by the protective layer, a structure is known, in which a low-resistance region, having the same conductivity type as that of the drift layer and having a higher impurity concentration than the drift layer, is provided around the protective layer. For example, in the trench gate MOSFET structure of Patent Document 1, a protective layer having a conductivity type opposite to that of a drift layer is formed on the bottom surface of a trench, and a low-resistance region, having the same conductivity type as that of the drift layer and having a higher impurity concentration than the drift layer, is formed to extend from the periphery of the lower portion of the trench to the lower end of the protective layer.

PRIOR ART DOCUMENT

Patent Document

Patent Document 1: Japanese Patent Application Laid-Open No. 2009-117593

SUMMARY

Problem to be Solved by the Invention

According to the structure of the above Patent Document 1, the extension of a depletion layer from the side surface of the protective layer is suppressed by the low-resistance region when the device is in an on-state. Thereby, the JFET resistance between the adjacent protective layers can be suppressed. However, a portion on which an electric field is likely to concentrate particularly when the device is in an off-state, specifically the corner of the trench is in contact with the low-resistance region having a high impurity concentration, and hence the electric field strength in a gate insulating film is likely to increase. In order to enhance the effect of reducing the JFET resistance in an on-state, it is desirable to further increase the impurity concentration of the low-resistance layer, but this increases the electric field strength in the gate insulating film. Therefore, there is a problem that it is difficult to achieve both low on-resistance and high reliability.

The present invention has been made to solve the above problem, and an object of the present invention is to provide a silicon carbide semiconductor device capable of reducing on-resistance while ensuring high reliability, and a manufacturing method of the same.

Means to Solve the Problem

A silicon carbide semiconductor device of the present invention has a drift layer, a body region, a source region, a gate insulating film, a gate electrode, at least one protective layer, at least one first low-resistance layer, and at least one second low-resistance layer. The drift layer is made of silicon carbide and has a first conductivity type. The body region is provided on the drift layer and has a second conductivity type. The source region is provided on the body region and has the first conductivity type. The gate insulating film is provided on each inner wall of at least one trench penetrating the source region and the body region. The gate electrode is provided in each of the at least one trench via the gate insulating film. The protective layer has at least a portion located below the trench, is in contact with the drift layer, and has the second conductivity type. The first low-resistance layer is in contact with the trench and the protective layer, straddles the border between the trench and the protective layer in the depth direction, has the first conductivity type, and has a higher impurity concentration than the drift layer. The second low-resistance layer is in contact with the first low-resistance layer, is away from the trench, has the first conductivity type, and has a higher impurity concentration than the first low-resistance layer.

A manufacturing method of a silicon carbide semiconductor device according to one aspect of the present invention includes the following steps. A semiconductor substrate provided with a drift layer that is made of silicon carbide and has a first conductivity type is provided. A trench is formed in the drift layer. By implanting impurities of a second conductivity type into the bottom surface of the trench, a protective layer: having at least a portion located below the trench; being in contact with the drift layer; and having the second conductivity type, is formed. By first ion implantation at an inclined angle with respect to the side surface of the trench, a first low-resistance layer: being in contact with the trench and the protective layer; straddling the border between the trench and the protective layer in the depth direction; having the first conductivity type; and having a higher impurity concentration than the drift layer, is formed. By second ion implantation at an inclined angle with respect to the side surface of the trench, a second low-resistance layer: being in contact with the first low-resistance layer; being away from the trench; having the first conductivity type; and having a higher impurity concentration than the first low-resistance layer, is formed.

A manufacturing method of a silicon carbide semiconductor device according to another aspect of the present invention includes the following steps. A semiconductor substrate provided with a drift layer that is made of silicon carbide and has a first conductivity type is provided. A trench is formed in the drift layer. By implanting impurities of a second conductivity type into the bottom surface of the trench, a protective layer: having at least a portion located below the trench; being in contact with the drift layer; and having the second conductivity type, is formed. By performing ion implantation at an inclined angle with respect to the side surface of the trench with an implantation energy selected such that the concentration peak of the implanted ions is away from the trench, a first low-resistance layer: being in contact with the trench and the protective layer; straddling the border between the trench and the protective layer in the depth direction; having the first conductivity type; and having a higher impurity concentration than the drift layer, and a second low-resistance layer: being in contact with the first low-resistance layer; being away from the trench; having the first conductivity type; and having a higher impurity concentration than the first low-resistance layer, are formed simultaneously.

A manufacturing method of a silicon carbide semiconductor device according to still another aspect of the present invention is a manufacturing method of a silicon carbide semiconductor device including: a drift layer made of silicon carbide and having a first conductivity type; a body region provided on the drift layer and having a second conductivity type; a source region provided on the body region and having the first conductivity type; a gate insulating film provided on each inner wall of at least one trench penetrating the source region and the body region; a gate electrode provided in each of the at least one trench via the gate insulating film; at least one protective layer having at least a portion located below the trench, being in contact with the drift layer, and having the second conductivity type; at least one first low-resistance layer being in contact with the trench and the protective layer, straddling the border between the trench and the protective layer in the depth direction, having the first conductivity type, and having a higher impurity concentration than the drift layer; and at least one second low-resistance layer being in contact with the first low-resistance layer, being away from the trench, having the first conductivity type, and having a higher impurity concentration than the first low-resistance layer, and the manufacturing method includes the following steps. A semiconductor substrate provided with at least part of the drift layer is provided. The first low-resistance layer and the second low-resistance layer are formed by epitaxial growth during which impurities are being added to obtain a higher impurity concentration than the drift layer.

Effects of the Invention

According to the present invention, the extension of a depletion layer from the vicinity of the border between the trench and the protective layer is suppressed by the first low-resistance layer. Further, the extension of the depletion layer can be further suppressed by the second low-resistance layer having a relatively high impurity concentration. On-resistance can be reduced by reducing the JFET resistance with the first low-resistance layer and the second low-resistance layer. Since the second low-resistance layer is away from the trench, excessive electric field concentration on the gate insulating film in the trench in an off-state can be suppressed. Thereby, a decrease in reliability due to the deterioration of the gate insulating film can be suppressed. From the above, the on-resistance can be reduced while high reliability is being ensured.

The object, characteristics, aspects, and advantages of the present invention will become more apparent from the following detailed description and the accompanying drawings.

BRIEF DESCRIPTION OF DRAWINGS

FIG. 1 is a partial cross-sectional view schematically illustrating a structure of a cell of a silicon carbide semiconductor device according to a first embodiment of the present invention.

FIG. 18 is a partial cross-sectional view schematically illustrating a structure of a cell of a silicon carbide semiconductor device according to a second embodiment of the present invention.

FIG. 25 is a partial cross-sectional view schematically illustrating a structure of a cell of a silicon carbide semiconductor device according to a fifth embodiment of the present invention.

DESCRIPTION OF EMBODIMENTS

Figure 2:
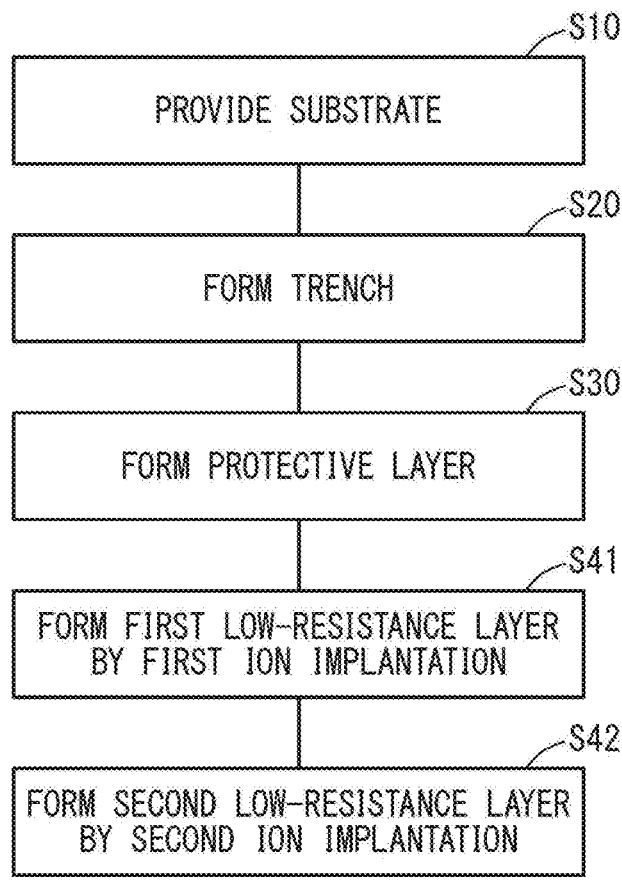
FIG. 2 is a flowchart schematically illustrating a manufacturing method of the silicon carbide semiconductor device of FIG. 1.

Hereinafter, embodiments of the present invention will be described with reference to the drawings. In the following drawings, the same or equivalent portions will be denoted by the same reference numerals, and description thereof will not be repeated. In the following description, the "impurity concentration" of a layer or a region means the highest value of the impurity concentration in the layer or the region.

First Embodiment (Overview of Configuration)

FIG. 1 is a partial cross-sectional view schematically illustrating a structure of a cell of a MOSFET 101 (silicon carbide semiconductor device) according to a first embodiment. The MOSFET 101 (silicon carbide semiconductor device) has a semiconductor layer 15, a gate insulating film 10, and a gate electrode 11, and the MOSFET 101 may further have a substrate 1 (semiconductor substrate), a source electrode 12, a drain electrode 13, and an interlayer insulating film 14. The semiconductor layer 15 has a drift layer 2, a body region 5, a source region 3, at least one protective layer 7, at least one first low-resistance layer 8, and at least one second low-resistance layer 9. The semiconductor layer 15 may further have a body contact region 4.

The drift layer 2 is made of silicon carbide. The drift layer 2 has a first conductivity type. The first conductivity type is either an n-type or a p-type, and is preferably an n-type. The body region 5 is provided on the drift layer 2. The body region 5 has a second conductivity type different from the first conductivity type. The source region 3 is provided on the body region 5 and has the first conductivity type. The gate insulating film 10 is provided on each inner wall of at least one trench 6 penetrating the source region 3 and the body region 5. The gate electrode 11 is provided in each of the trenches 6 via the gate insulating film 10.

The protective layer 7 has the second conductivity type. The protective layer 7 is in contact with the drift layer 2. It is preferable that the protective layer 7 be short-circuited to the source electrode 12. The protective layer 7 has at least a portion located below the trench 6. In the present embodiment, the upper end of the protective layer 7 is in contact with the lower end of the trench 6, in other words, the bottom surface, and this contact portion is a border BD. In the example illustrated in FIG. 1, the protective layer 7 is located only below the trench 6, but part of the protective layer 7 may be located above the lower end of the trench 6. Although described in detail in a fifth embodiment, the upper end of the protective layer 7 and the lower end of the trench 6 do not necessarily need to be in contact with each other, and when they are away from each other, the border BD means the area between them in the depth direction.

The first low-resistance layer 8 is in contact with the trench 6 and the protective layer 7. The first low-resistance layer 8 straddles the border BD between the trench 6 and the protective layer 7 in the depth direction. The first low-resistance layer 8 has the first conductivity type, and has a higher impurity concentration than the drift layer 2. The impurity concentration of the first low-resistance layer 8 may become higher as more away from the trench 6. It is preferable that the width in the in-plane direction of the first low-resistance layer 8 be 0.1 μm or more.

The second low-resistance layer 9 is in contact with the first low-resistance layer 8, and is away from the trench 6. The second low-resistance layer 9 has the first conductivity type, and has a higher impurity concentration than the first low-resistance layer 8. It is preferable that the concentration of impurities of the first conductivity type of the second low-resistance layer 9 be $3 \times 10^{17}$ cm$^{-3}$ or lower. It is preferable that the width in the in-plane direction of the second low-resistance layer 9 be 0.1 μm or more.

(Details of Configuration)

The semiconductor layer 15 is formed on the surface of the substrate 1. The drain electrode 13 is formed on the back surface of the substrate 1. The trench 6 is formed in the surface of the semiconductor layer 15. The gate insulating film 10 and the gate electrode 11 are formed in the trench 6. On the semiconductor layer 15, the interlayer insulating film 14 is formed in an area over the trench 6 so as to cover the gate electrode 11, and the source electrode 12 is formed in another area.

The substrate 1 is a silicon carbide semiconductor substrate of the first conductivity type. The semiconductor layer 15 is an epitaxial layer formed by epitaxial growth of a silicon carbide semiconductor on the substrate 1.

The drift layer 2 is located on the substrate 1. The drift layer 2 has a concentration of impurities of the first conductivity type lower than the substrate 1. The protective layer 7 is formed in the drift layer 2.

The body region 5 is formed on the drift layer 2. The source region 3 and the body contact region 4 are formed on the body region 5. The body contact region 4 has the second conductivity type, and has a concentration of impurities of the second conductivity type higher than the body region 5.

The trench 6 is formed to penetrate the body region 5 from the surface of the semiconductor layer 15, more specifically, the surface of the source region 3, and to reach at least one of the protective layer 7 and the drift layer 2. The gate insulating film 10 is formed on the inner wall (bottom and side surfaces) of the trench 6. The gate insulating film 10 is, for example, an oxide film. The gate electrode 11 is embedded on the gate insulating film 10 in the trench 6.

The source electrode 12 is formed on the surface of the semiconductor layer 15 so as to contact the source region 3 and the body contact region 4. Thereby, the source electrode 12 is electrically connected to the source region 3. The source electrode 12 is a silicide layer formed by a reaction between a metal, such as Ni or Ti, and SiC of the semiconductor layer 15, and forms an ohmic contact with each of the source region 3 and the body contact region 4. The drain electrode 13 is formed on the back surface of the substrate 1. The drain electrode 13 is a metal electrode such as Ni.

The protective layer 7 is formed in the drift layer 2 below the trench 6, and is formed to contact the lower end of the trench 6 in the present embodiment. The first low-resistance layer 8 is in contact with the side surface of the trench 6 and at least part of the protective layer 7. The second low-resistance layer 9 is in contact with the side surface of the first low-resistance layer 8.

Subsequently, the impurity concentration of each of the layers and regions will be described. The concentration of impurities of the first conductivity type of the drift layer 2 is $1.0 \times 10^{14}$ to $1.0 \times 10^{17}$ cm$^{-3}$, which is set based on the breakdown voltage of the MOSFET, etc. The concentration of impurities of the second conductivity type of the body region 5 is $1.0 \times 10^{14}$ to $1.0 \times 10^{18}$ cm$^{-3}$. The concentration of impurities of the first conductivity type of the source region 3 is $1.0 \times 10^{18}$ to $1.0 \times 10^{21}$ cm$^{-3}$. The concentration of impurities of the second conductivity type of the body contact region 4 is $1.0 \times 10^{18}$ to $1.0 \times 10^{21}$ cm$^{-3}$, which is set to a concentration of impurities of the second conductivity type higher than the body region 5 in order to reduce the contact resistance with the source electrode 12. It is preferable that the concentration of impurities of the second conductivity type of the protective layer 7 be $1.0 \times 10^{14}$ or higher and $1.0 \times 10^{20}$ cm$^{-3}$ or lower, and its concentration profile may not be uniform. The impurity concentrations of the first low-resistance layer 8 and the second low-resistance layer 9 are higher than the impurity concentration of the drift layer 2. The impurity concentration of the second low-resistance layer 9 is higher than the impurity concentration of the first low-resistance layer 8.

At the border between the first low-resistance layer 8 and the second low-resistance layer 9, there may be a sharp impurity concentration difference, or the impurity concentration may change gently. From the first low-resistance layer 8 to the second low-resistance layer 9, if there is a position at which the impurity concentration changes sharply, or a position at which the concentration gradient with respect to the distance from the trench 6 is larger than that of the neighborhood although the concentration gradient changes gradually when the impurity concentration is plotted with respect to the distance from the trench 6, either of the positions is considered as the border between the first low-resistance layer 8 and the second low-resistance layer 9. If such a position is not present clearly and the impurity concentration increases gradually from the side surface of the trench 6 to the side surface of the second low-resistance layer 9 via the first low-resistance layer 8, a position at which the impurity concentration is half of the peak value of the second low-resistance layer 9 is considered as the border between the first low-resistance layer 8 and the second low-resistance layer 9.

Next, the operation of the silicon carbide semiconductor device will be briefly described. In FIG. 1, when a voltage higher than or equal to a threshold voltage is applied to the gate electrode 11, the conductivity type is reversed along the side surface of the trench 6 in the body region 5, whereby a channel of the first conductivity type is formed. Then, a current path of the same conductivity type is formed between the source electrode 12 and the drain electrode 13. This allows a current to flow between these electrodes. The state, in which a voltage higher than or equal to a threshold voltage is applied to the gate electrode 11 in this way, is an on-state of the MOSFET 101. On the other hand, when a voltage lower than the threshold voltage is applied to the gate electrode 11, the above-described channel is not formed, so that a current path as in the on-state is not formed. Therefore, even if a voltage is applied between the drain electrode 13 and the source electrode 12, almost no current flows between these electrodes. Such a state in which the voltage of the gate electrode 11 is lower than the threshold voltage is an off-state of the MOSFET 101. Therefore, the operating state of the MOSFET 101 can be switched between the on-state and the off-state by controlling the voltage to be applied to the gate electrode 11.

(Manufacturing Method)

FIG. 2 is a flowchart schematically illustrating a manufacturing method of the MOSFET 101 (FIG. 1). Each of FIGS. 3 to 8 is a partial cross-sectional view schematically illustrating one of first to sixth steps of the manufacturing method of the MOSFET 101 (FIG. 1). The manufacturing method of the MOSFET 101 will be described below with reference to these views.

Figure 3:
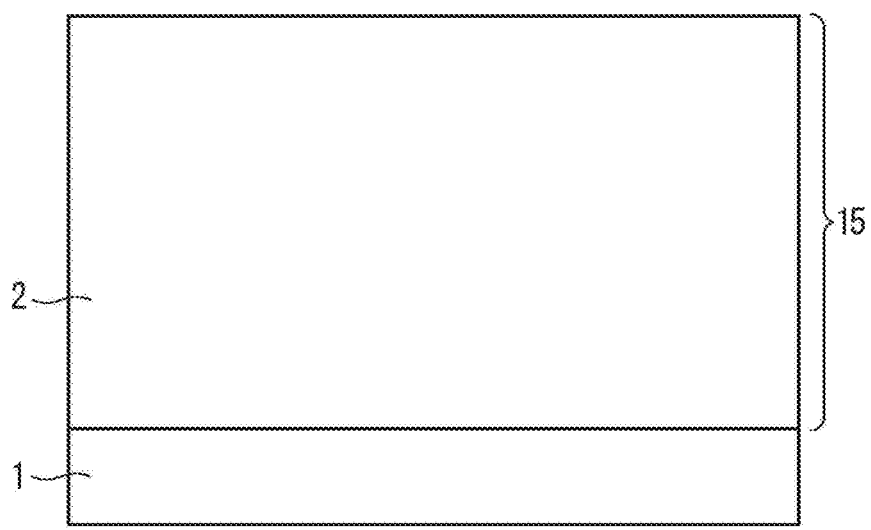
FIG. 3 is a partial cross-sectional view schematically illustrating a first step of the manufacturing method of the silicon carbide semiconductor device of FIG. 1.

With reference to FIG. 3, the substrate 1, in which the drift layer 2 made of silicon carbide and having the first conductivity type is provided as the semiconductor layer 15, is provided in a step S10 (FIG. 2). The semiconductor layer 15 can be formed by epitaxial growth on the substrate 1. The concentration of impurities of the first conductivity type of the semiconductor layer 15 is selected to correspond to the concentration of impurities of the first conductivity type of the drift layer 2 included in the MOSFET 101 that is finally obtained.

Figure 4:
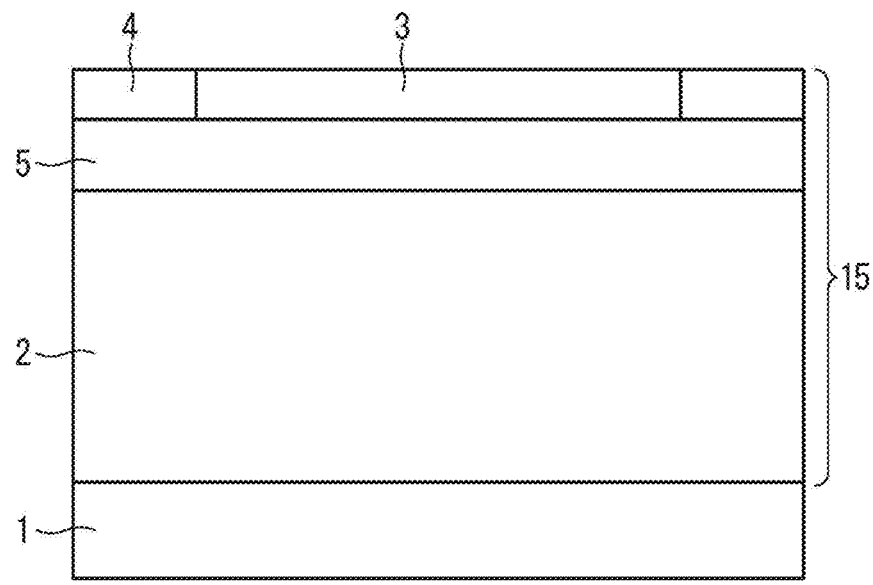
FIG. 4 is a partial cross-sectional view schematically illustrating a second step of the manufacturing method of the silicon carbide semiconductor device of FIG. 1.

With reference to FIG. 4, the source region 3, the body contact region 4, and the body region 5 are formed in the upper portion of the semiconductor layer 15 by ion implantation. When an n-type region is formed, for example, N (nitrogen) or P (phosphorus) ions are implanted as donors, and when a p-type region is formed, for example, Al (aluminum) or B (boron) ions are implanted as acceptors. Conditions for the ion implantation are determined such that the impurity concentration of each region becomes the above-described value. The order of forming the respective regions is arbitrary. Alternatively, at least any one of the regions may be formed by epitaxial growth instead of ion implantation.

Figure 5:
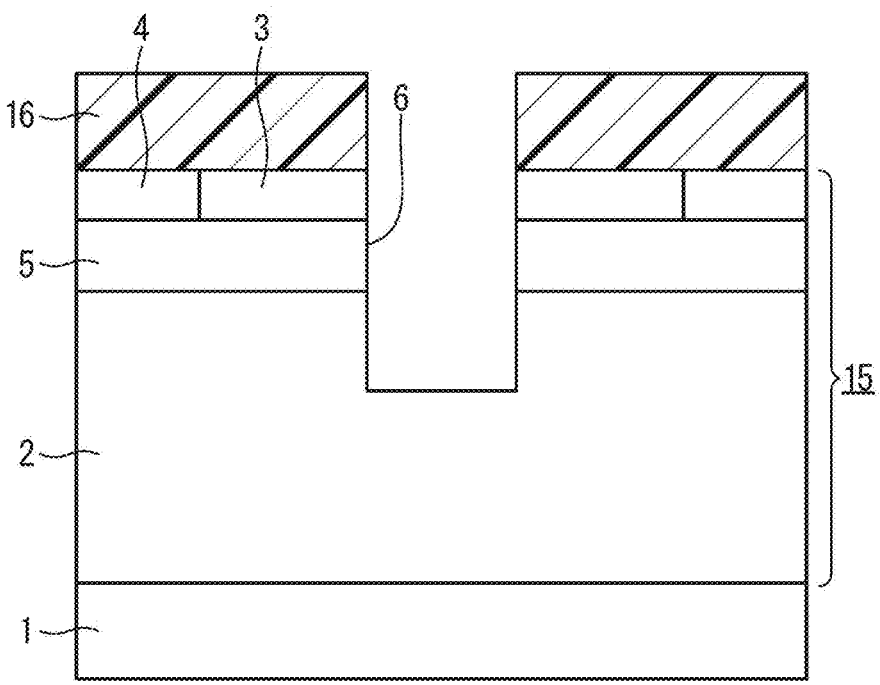
FIG. 5 is a partial cross-sectional view schematically illustrating a third step of the manufacturing method of the silicon carbide semiconductor device of FIG. 1.

With reference to FIG. 5, the trench 6, penetrating from the surface of the source region 3 the body layer 5 to reach the drift layer 2, is formed in the semiconductor layer 15 in a step S20 (FIG. 2). For example, reactive ion etching (RIE) using a mask 16 having an opening corresponding to the trench 6 is performed.

Figure 6:
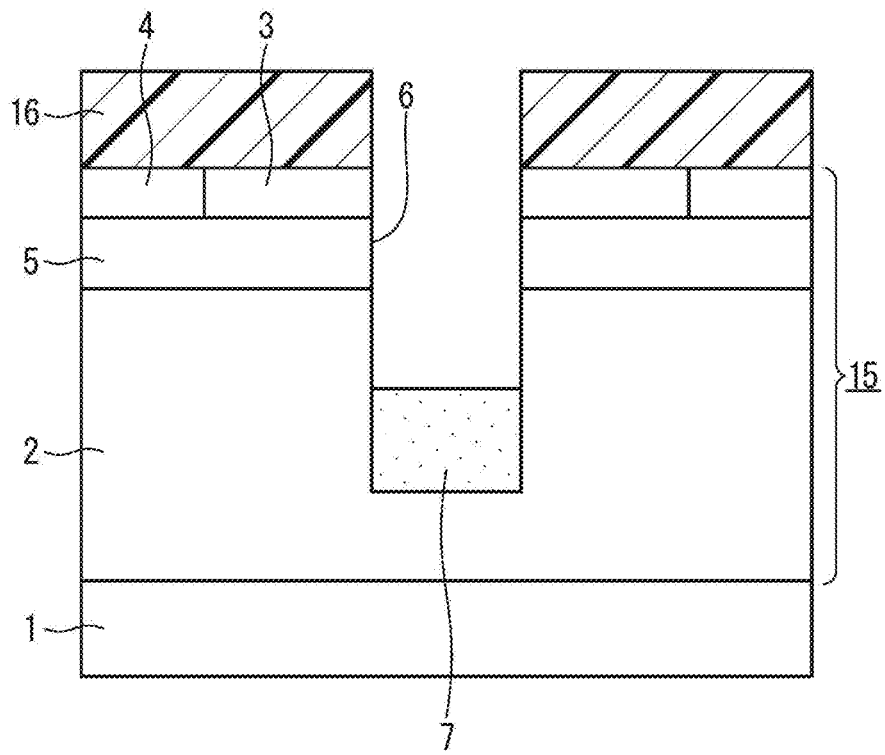
FIG. 6 is a partial cross-sectional view schematically illustrating a fourth step of the manufacturing method of the silicon carbide semiconductor device of FIG. 1.

With reference to FIG. 6, impurities of the second conductivity type are implanted into the bottom surface of the trench 6 in a step S30 (FIG. 2). Thereby, the protective layer 7, having at least a portion located below the trench 6, being in contact with the drift layer 2, and having the second conductivity type, is formed. As illustrated in FIG. 6, this implantation may be performed by using a mask 16 having an opening corresponding to the bottom surface of the trench 6. Here, the protective layer 7 may be formed in the trench 6 by epitaxial growth after the trench 6 is formed to be deeper by only the thickness of the protective layer 7. Alternatively, the protective layer 7 may be formed by being embedded in advance by ion implantation or epitaxial growth when the semiconductor layer 15 is formed; and in this case, the epitaxial growth of the semiconductor layer 15 is resumed on the protective layer 7 that has been formed, and then the trench 6 is formed.

Figure 7:
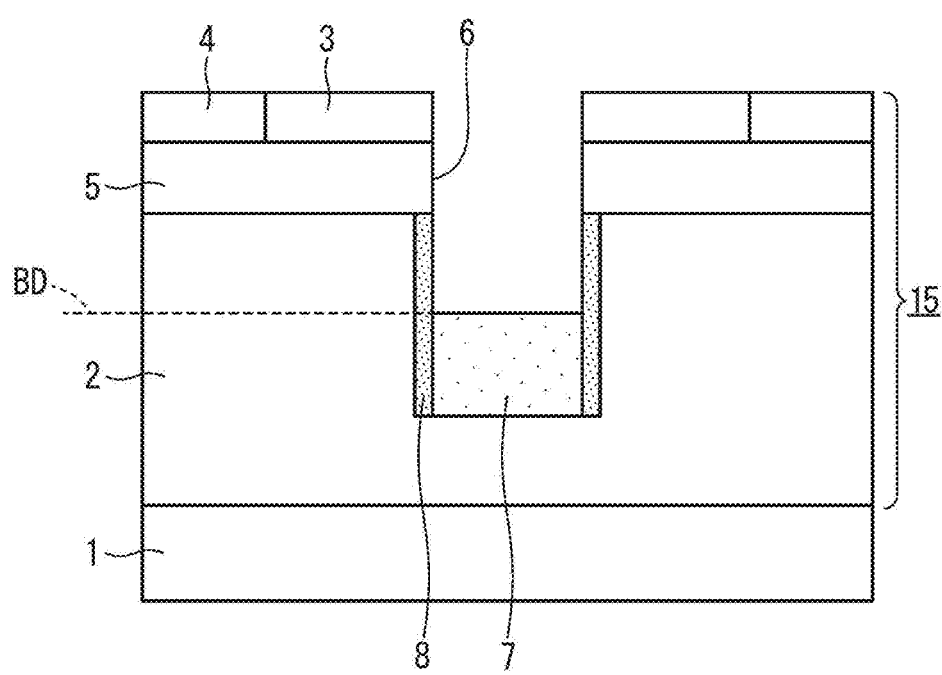
FIG. 7 is a partial cross-sectional view schematically illustrating a fifth step of the manufacturing method of the silicon carbide semiconductor device of FIG. 1.

With reference to FIG. 7, first ion implantation at an inclined angle with respect to the side surface of trench 6 is performed in a step S41 (FIG. 2). In the present description, the "angle" in relation to the ion implantation is defined such that an angle perpendicular to the side surface is 90 degrees and an angle parallel to the side surface is 0 degrees, and "the inclined angle" means an angle lager than 0 degrees and smaller than 90 degrees. The first low-resistance layer 8 is formed by the first ion implantation. As described before, the first low-resistance layer 8 is in contact with the trench 6 and the protective layer 7, straddles the border BD between the trench 6 and the protective layer 7 in the depth direction, has the first conductivity type, and has a higher impurity concentration than the drift layer 2.

Figure 8:
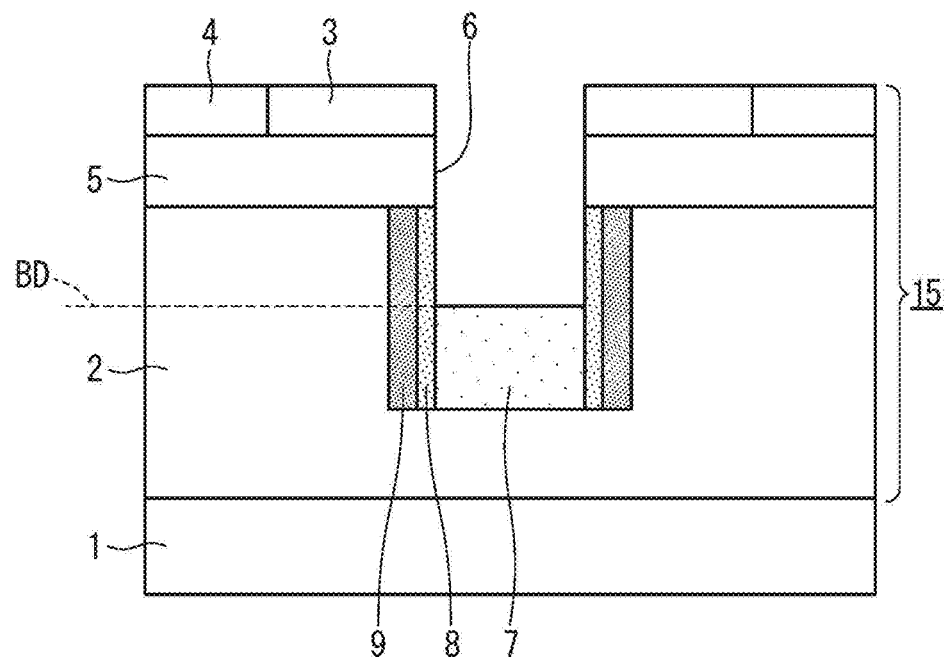
FIG. 8 is a partial cross-sectional view schematically illustrating a sixth step of the manufacturing method of the silicon carbide semiconductor device of FIG. 1.

With reference to FIG. 8, second ion implantation at an inclined angle with respect to the side surface of the trench 6 is performed in a step S42 (FIG. 2). The second low-resistance layer 9 is formed by the second ion implantation. As described before, the second low-resistance layer 9 is in contact with the first low-resistance layer 8, is away from the trench 6, has the first conductivity type, and has a higher impurity concentration than the first low-resistance layer 8.

The implantation energy of the second ion implantation (FIG. 8) is set to be higher than the energy of the first ion implantation (FIG. 8). It is preferable that the dose of the second ion implantation be higher than the dose of the first ion implantation. The order of the first ion implantation and the second ion implantation may be reversed. In other words, the first low-resistance layer 8 may be formed after the second low-resistance layer 9 is formed, in which the second low-resistance layer 9 is in contact with the first low-resistance layer 8.

Alternatively, the first low-resistance layer 8 and the second low-resistance layer 9 may be formed simultaneously. In order to achieve that, ion implantation of the first conductivity type is performed by setting the implantation energy and the dose such that, for example, the peak of the impurity concentration is formed at a position away from the trench 6 and the tail of the impurity concentration profile contacts the side surface of the trench 6. At this time, a tail region, where the impurity concentration is less than or equal to half of the peak value, is considered as the first low-resistance layer 8. After the above ion implantation, similar ion implantation is performed again after the substrate 1 is rotated by 180 degrees, whereby the first low-resistance layer 8 and the second low-resistance layer 9 can be formed on both the side surfaces of the trench 6. Although described later in detail, the second low-resistance layer 9 may contact, at this time, another second low-resistance layer 9 formed near the side surface of another adjacent trench 6, unlike FIG. 1.

At the time of the ion implantation at an inclined angle, the mask 16 may be used, or the mask 16 may have been removed. In any case, it is preferable that the implantation angle be smaller than or equal to the angle formed by the diagonal line extending from the upper end of one side surface of the mask 16 or the trench 6 to the lower end of the opposite side surface of the trench 6. Thereby, the first low-resistance layer 8 and the second low-resistance layer 9 can be formed around the trench 6 and the protective layer 7.

Alternatively, the first low-resistance layer 8 and the second low-resistance layer 9 may be formed by epitaxial growth, vertical ion implantation, or a combination thereof. In that case, a region from the upper portion of the semiconductor layer 15 or the lower portion of the body region 5 to the lower portion of the trench 6 or the lower portion of the protective layer 7 may be formed by multiple epitaxial growth, the conditions of each of which are adjusted. Also, the first low-resistance layer 8 may be formed below the protective layer 7.

With reference to FIG. 1 again, the gate insulating film 10 is subsequently formed on the bottom and side surfaces in the trench 6. The gate electrode 11 is formed on the gate insulating film 10 so as to be embedded in the trench 6. Then, the interlayer insulating film 14 is formed to cover the gate electrode 11. Thereafter, the source electrode 12 is formed to contact the surface of the source region 3 and the surface of the body contact region 4. The drain electrode 13 is formed on the back surface of the substrate 1. Through the above steps, the MOSFET 101 can be manufactured.

Figure 9:
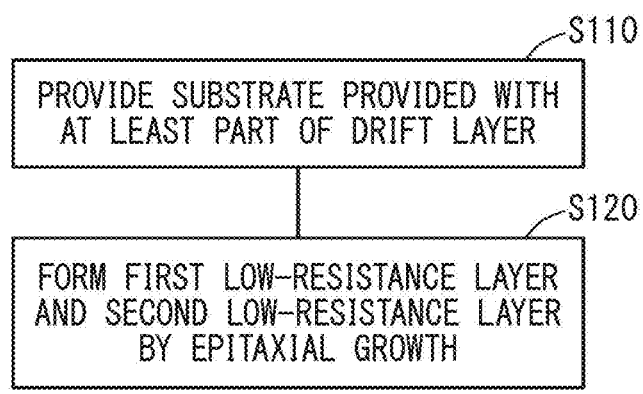
FIG. 9 is a flowchart schematically illustrating a modification of the manufacturing method of the silicon carbide semiconductor device of FIG. 1.

FIG. 9 is a flowchart schematically illustrating a modification of the manufacturing method. As described above, part or all of the ion implantation steps in the manufacturing method can be replaced by epitaxial growth. In that case, the substrate 1 provided with at least part of the drift layer 2 is provided in a step S110. Next, the first low-resistance layer 8 and the second low-resistance layer 9 are formed by epitaxial growth during which impurities are being added to obtain a higher impurity concentration than the drift layer 2, in a step S120. Steps other than these steps are substantially the same as those in the above manufacturing method of the first embodiment.

COMPARATIVE EXAMPLE

Figure 10:
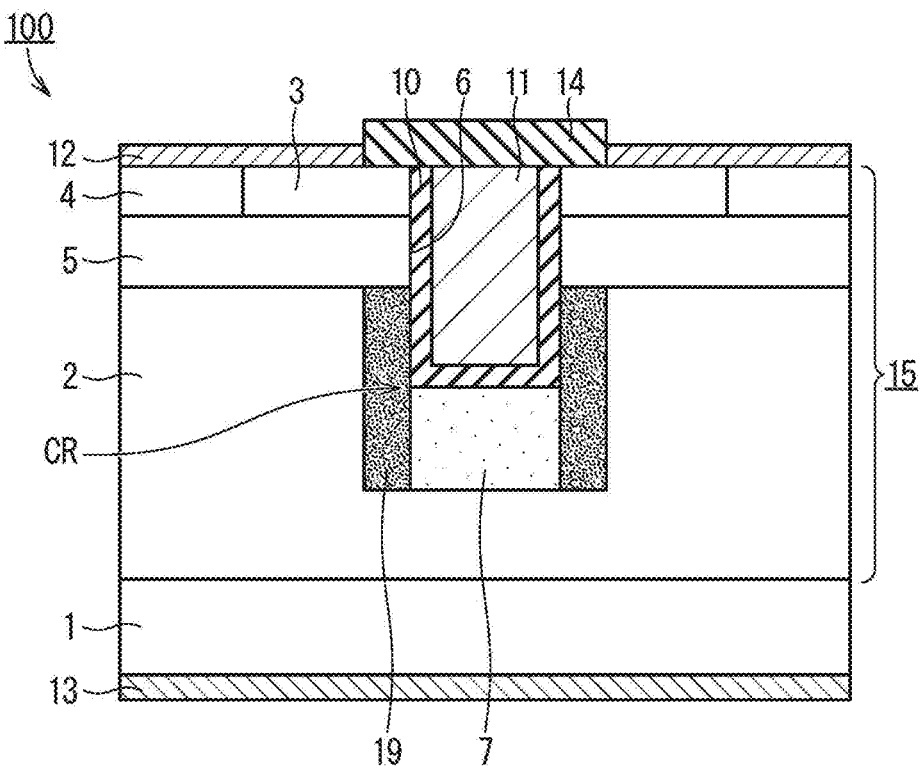
FIG. 10 is a partial cross-sectional view illustrating a configuration of a silicon carbide semiconductor device of a comparative example.

FIG. 10 is a partial cross-sectional view illustrating a configuration of a MOSFET 100 of a comparative example.

The MOSFET 100 has one low-resistance layer 19 having a constant impurity concentration in a region corresponding to the first low-resistance layer 8 and the second low-resistance layer 9 (FIG. 1). Here, the range of an impurity region refers to a region where the impurity concentration is higher than or equal to half of the maximum value of the impurity concentration of the region, as described before. Therefore, for example, when a box-type impurity region is formed by ion implantation or the like, a series of regions, having an impurity concentration between the maximum value and half of the maximum value, is considered as a single layer "having a constant impurity concentration."

The first low-resistance layer 8 and the second low-resistance layer 9 formed at positions deeper than the bottom surface of the trench 6 suppress the extension of a depletion layer spreading from the protective layer 7. In a p-n junction, a depletion layer width $(l_n)$ in an n-type region can be estimated, from the concentrations of both the p-type and n-type impurities and an applied bias, by the following equation and based on the basic laws of semiconductor physics.

$$l_n = \frac{N_a}{N_a + N_d} \sqrt{\frac{2\varepsilon_s}{q}\left(\frac{1}{N_a} + \frac{1}{N_d}\right)(\Phi_{bi} - V_a)} \quad \text{[Equation 1]}$$

Here, $N_a$ is an acceptor concentration, $N_d$ is a donor concentration, $\varepsilon_s$ is a vacuum permittivity, q is an elementary charge, $\Phi_{bi}$ is a diffusion potential, and $V_a$ is an applied bias. The diffusion potential $\Phi_{bi}$ is obtained by the following equation.

$$\Phi_{bi} = \frac{kT}{q} \ln \frac{N_c N_d}{n_i^2} \quad \text{[Equation 2]}$$

Here, k is the Boltzmann's constant, T is a temperature, and $n_i$ is an intrinsic carrier density.

Figure 11:
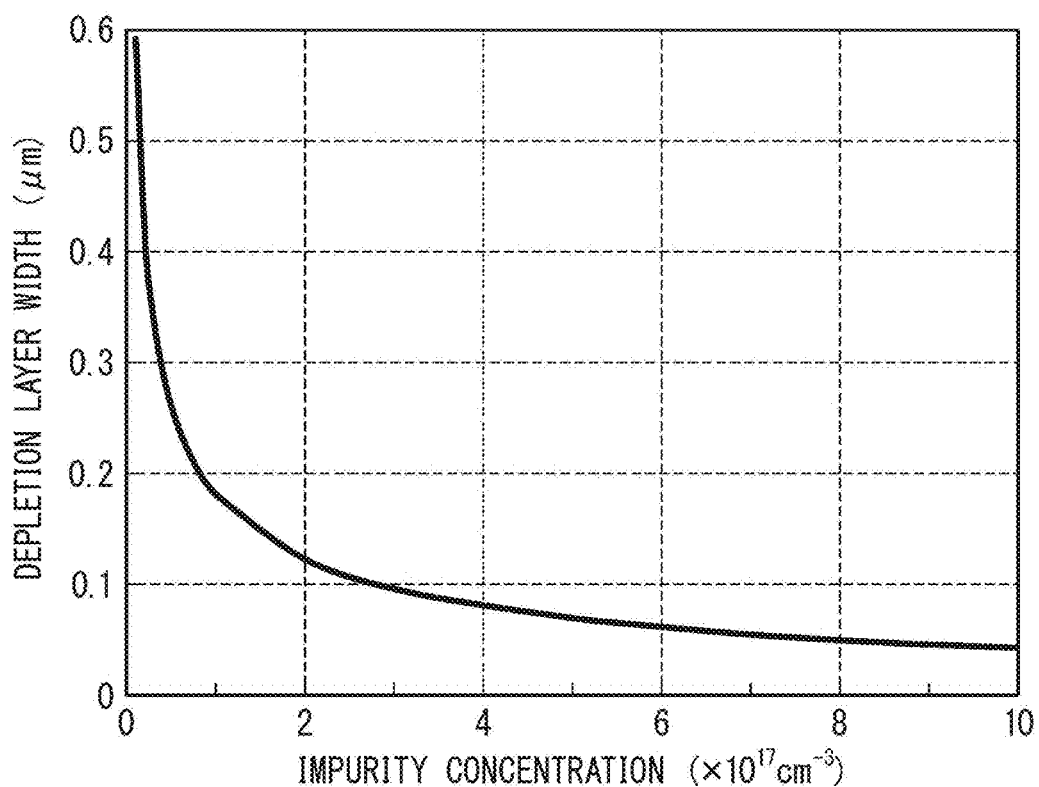
FIG. 11 is a graph showing a relationship between a depletion layer width and an n-type impurity concentration in an n-type region forming a p-n junction.

FIG. 11 is a graph showing the relationship between a depletion layer width and an n-type impurity concentration in an n-type region forming a p-n junction. The higher the impurity concentration, the smaller the depletion layer width. When the impurity concentration is about $3 \times 10^{17}$ cm$^{-3}$ or higher, a change in the depletion layer width becomes small. In other words, the effect of suppressing the depletion layer by increasing the impurity concentration to about $3 \times 10^{17}$ cm$^{-3}$ is large, but even if the impurity concentration is further increased, the effect is not significantly improved.

The electric field strength in a region formed in the drift layer 2 is likely to become higher as the impurity concentration thereof is higher. Therefore, it is desirable that the impurity concentration of a low-resistance layer be the minimum one among the impurity concentrations at which the required effect can be obtained. In order to keep a depletion layer in a layer having an impurity concentration of, for example, $3 \times 10^{17}$ cm$^{-3}$, the width of the layer should be 0.1 μm or more, from the graph of FIG. 11 described above. When the impurity concentration changes in a layer, the minimum value of the width of the layer can be generally determined from the average of the impurity concentration. The first low-resistance layer 8 and the second low-resistance layer 9 have the effect of suppressing the extension in the in-plane direction (horizontal direction in FIG. 1) of the depletion layer and the effect of diffusing a current, and from the viewpoint of the effects, it is desirable that the width of each layer (dimension in the horizontal direction in FIG. 1), particularly the width of the second low-resistance layer 9 that has high effects due to its high concentration be large. It is also preferable that the width obtained by adding the width of the first low-resistance layer 8 and the width of the second low-resistance layer 9 be made larger than the depletion layer width assumed from the average impurity concentration of the region occupied by the first low-resistance layer 8 and the second low-resistance layer 9.

(Simulation of Electric Field Strength)

Figure 12:
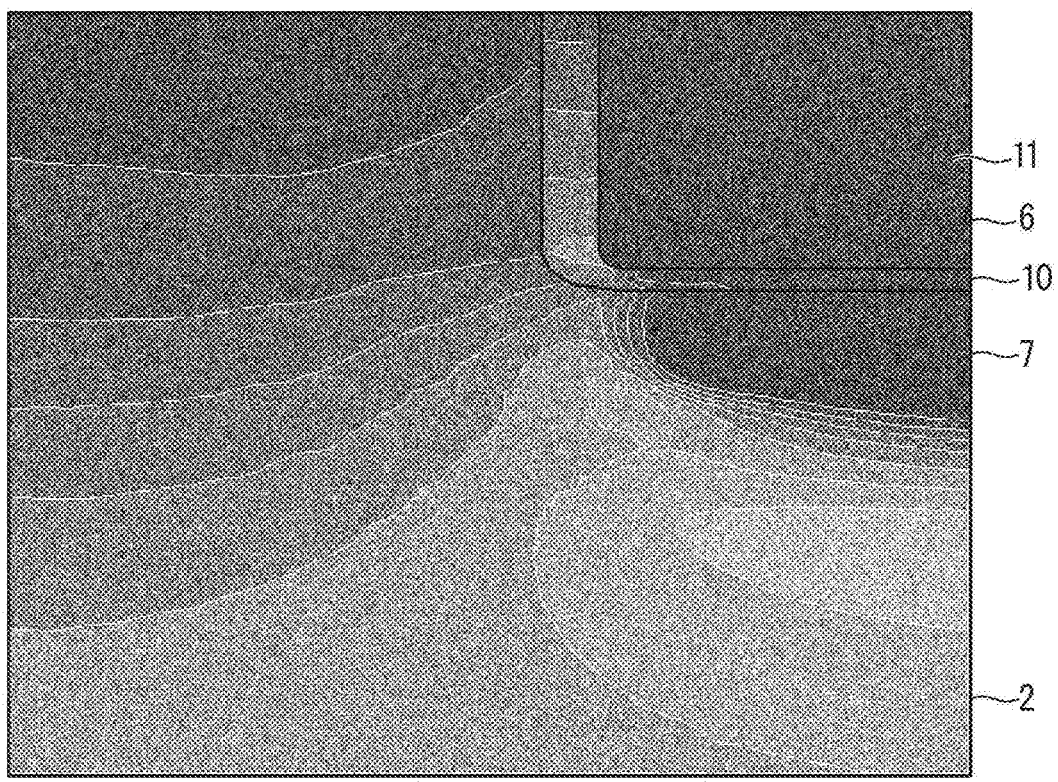
FIG. 12 is a distribution map showing a result of simulation of an electric field strength near a lower end of a trench of the silicon carbide semiconductor device of the comparative example.
Figure 13:
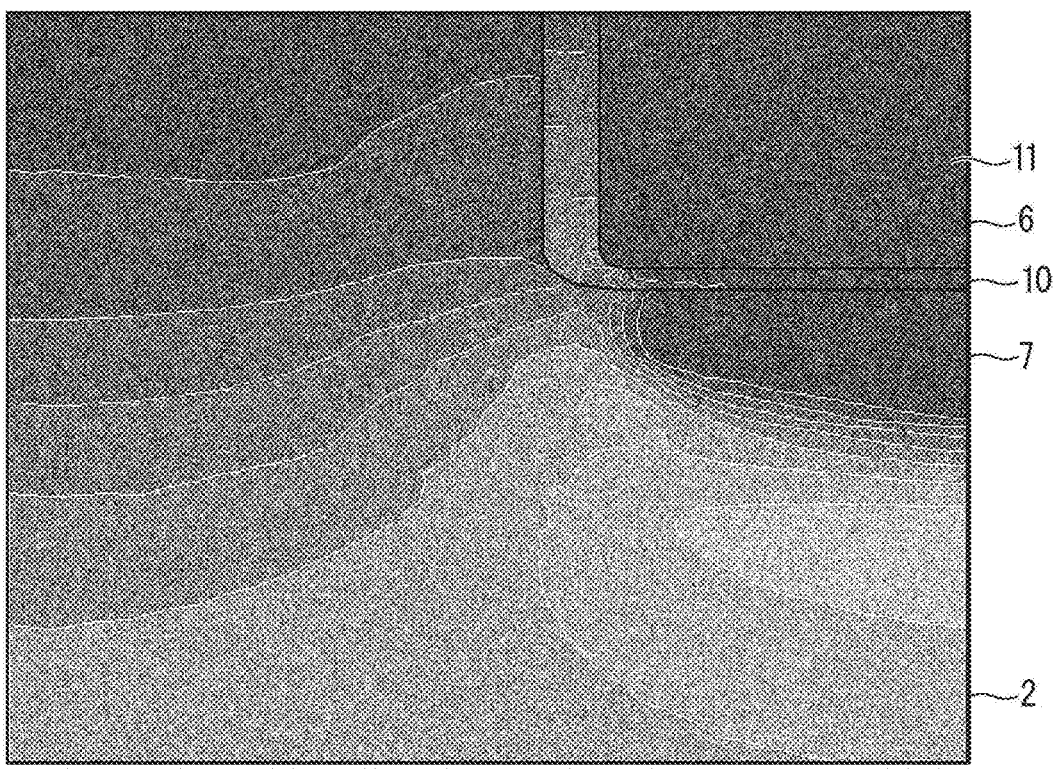
FIG. 13 is a distribution map showing a result of simulation of an electric field strength in an off-state near the lower end of a trench of the silicon carbide semiconductor device of an example according to the first embodiment of the present invention.
Figure 14:
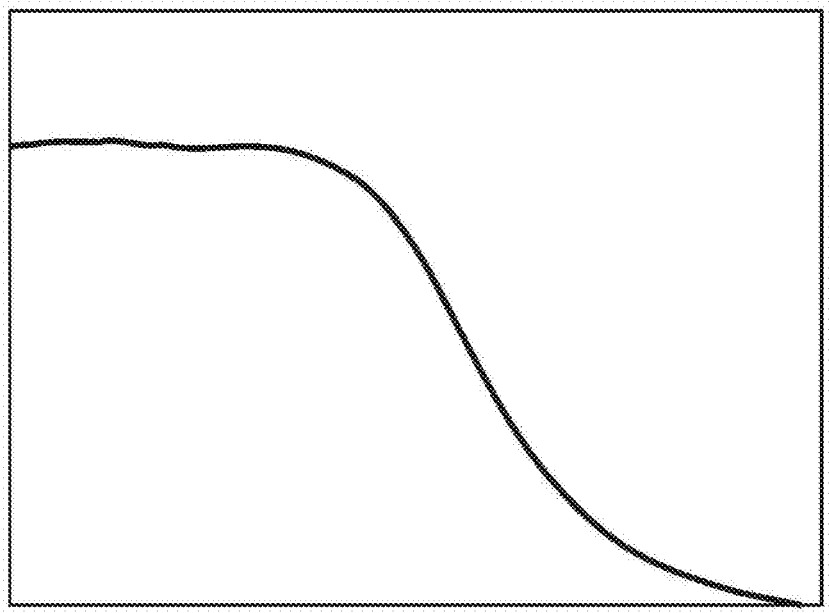
FIG. 14 is a graph showing an impurity concentration distribution in a low-resistance layer used in the simulation of FIG. 12.
Figure 15:
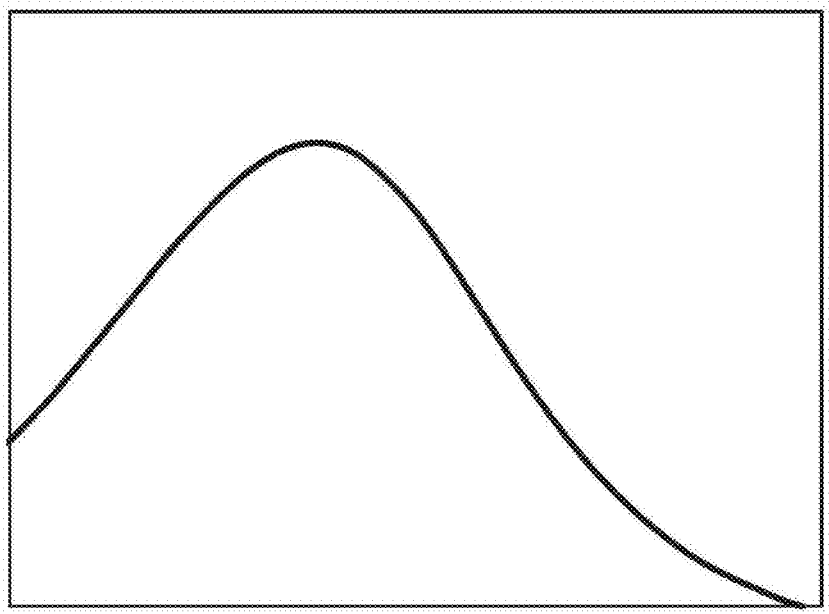
FIG. 15 is a graph showing an impurity concentration distribution in the low-resistance layer used in the simulation of FIG. 13.

FIGS. 12 and 13 are distribution maps showing the results of simulations of the electric field strength in an off-state near the lower ends of the trenches of the MOSFET 100 (FIG. 10: comparative example) and the MOSFET 101 (FIG. 1: example), respectively. FIGS. 14 and 15 are graphs showing the impurity concentration distributions of the low-resistance layers to be used in the simulations of FIGS. 12 and 13, respectively. In FIGS. 14 and 15, the "distance from trench" represents a distance along the in-plane direction (horizontal direction in FIG. 1 or FIG. 10) from the side surface of the trench 6, and the "impurity concentration" represents a one-dimensional impurity concentration distribution of a low-resistance layer (in the example, the first low-resistance layer and the second low-resistance layer) with respect to the distance.

In the comparative example, the impurity concentration of the low-resistance layer is substantially constant near the side surface of the trench 6, decreases from the vicinity of the border with the drift layer 2, and reaches the concentration of the drift layer, as shown in FIG. 14. Such a profile is obtained as a so-called box-type profile. The box-type profile is obtained by performing multiple inclined implantations with different implantation energies into the inner wall of the trench 6 and making the impurity concentration constant near the peak value of each implantation.

On the other hand, in the example, the impurity concentration is relatively low near the side surface of the trench 6, and becomes higher as more away from the trench 6, and when further away, the impurity concentration reaches the impurity concentration of the drift layer after decreasing from the vicinity of the border with the drift layer 2 similarly to the comparative example, as shown in FIG. 15. Such a profile can be obtained, for example, by performing multiple inclined implantations with different implantation energies into the inner wall of the trench 6 and performing them in a higher dose as the energy is higher. Alternatively, one or more implantations may be performed instead, so that a peak of the impurity concentration is generated at a position away from the trench 6 and the tail portion contacts the trench 6.

Next, with reference to FIGS. 12 and 13, each of these maps shows an electric field distribution in a region from the vicinity of the bottom surface of the body region 5 to several μm below the protective layer 7 in the vertical direction. A region shown in whiter represents a region with a higher field strength, while a region shown in blacker represents a region with a lower field strength. The simulation conditions in FIGS. 12 and 13 are set such that: the structural conditions other than the first low-resistance layer 8 and the second low-resistance layer 9 are common; and the on-resistances and breakdown voltages of the MOSFETs are equal. It can be seen, commonly to both the maps, that when a drain voltage is applied in an off-state, a high electric field is applied to the gate insulating film 10 formed at the corner of the trench 6 and to the bottom surface of the protective layer 7. That is, when a high voltage is applied, an electric field is likely to concentrate on these positions. Specifically, in the comparative example shown in FIG. 12, the maximum electric field strength in the gate insulating film 10 is 1.8 MV/cm.

On the other hand, also in the example shown in FIG. 13, an electric field concentrates on the same places, but the maximum electric field strength in the gate insulating film 10 located at the corner of the trench 6 is 1.6 MV/cm, which is lower. In the example, the first low-resistance layer 8 (FIG. 1) having a relatively low impurity concentration is in contact with the position of the maximum electric field strength, and the concentration of impurities of the second conductivity type is kept high in the portion overlapping the protective layer 7, and the area of the protective layer 7 covering the trench 6 is large. In addition, the electric field is high in a region corresponding to the second low-resistance layer 9 (FIG. 1) around the bottom of the trench 6, but excessive electric field concentration does not occur in a region immediately close to the trench 6, the region corresponding to the first low-resistance layer. This is considered as an electric field relaxation effect due to the low impurity concentration of the first low-resistance layer 8. From the above, it can be seen that a trade-off between the electric field strength in the gate insulating film 10 in an off-state and the on-resistance is improved by providing the first low-resistance layer 8 having a relatively low impurity concentration near the side surface of the trench 6.

Further, since the impurity concentration near the side surface of the trench 6 is low, the area, where the body region 5 located over the first low-resistance layer 8 contacts the trench 6, is kept large. Thereby, a long channel length can be ensured. Thereby, the effects of improving threshold voltage characteristics, on characteristics, breakdown strength, etc. can be obtained.

(Summary of Effects)

According to the present embodiment, the extension of the depletion layer from the vicinity of the border BD between the trench 6 and the protective layer 7 can be suppressed by the first low-resistance layer 8. Further, the extension of the depletion layer can be further suppressed by the second low-resistance layer 9 having a relatively high impurity concentration. The on-resistance can be reduced by reducing the JFET resistance with the first low-resistance layer 8 and the second low-resistance layer 9. Since the second low-resistance layer 9 is away from the trench 6, excessive electric field concentration on the gate insulating film 10 in the trench 6 in an off-state can be suppressed. Thereby, a decrease in reliability due to the deterioration of the gate insulating film 10 can be suppressed. From the above, the on-resistance can be reduced while high reliability is being ensured.

In particular, in the configuration illustrated in FIG. 1, the trench 6 has a corner, and the second low-resistance layer 9 is away from the corner. Thereby, the contact area between the interface near the bottom of the trench 6 and the protective layer is increased, and an electric field is less likely to concentrate. Therefore, the electric field strength in the gate insulating film 10 can be kept low.

Further, the first low-resistance layer 8 having a higher concentration than the drift layer 2 also suppresses the expansion of the depletion layer from the lower portion of the body region 5. Thereby, the JFET resistance can be further reduced.

Additionally, the entire side surface of the trench 6 is in contact with the first low-resistance layer 8 having a higher impurity concentration than the drift layer 2. Therefore, the JFET resistance, which may occur between the body region 5 arranged along the side surface of the trench 6 and the protective layer 7, is reduced. Thereby, the on-resistance can be reduced and the trench 6 can be formed to be shallow, whereby: the electric field strength to be applied to the lower portion of the trench 6 and the vicinity of the lower portion of the protective layer 7 can be reduced; the electric field strength in the gate insulating film 10 can be reduced; and the breakdown voltage can be improved. In general, a trade-off between the electric field strength in the gate insulating film 10 in an off-state and the on-resistance can be improved by the present embodiment.

Further, in the present embodiment, the second low-resistance layer 9 extends to the side of the protective layer 7 by straddling the border BD. Thereby, depletion from the side surface of the protective layer 7 can be effectively suppressed. Therefore, the on-resistance can be further reduced.

The concentration of impurities of the first conductivity type of the second low-resistance layer 9 is $3 \times 10^{17}$ cm$^{-3}$ or lower. Thereby, depletion in the drift layer 2 can be effectively suppressed without causing extreme electric field concentration. Therefore, excessive electric field concentration on the gate insulating film 10 in the trench 6 in an off-state can be more reliably suppressed. Thereby, high reliability can be more reliably ensured.

The width in the in-plane direction of the first low-resistance layer 8 is 0.1 μm or more. Thereby, depletion in the drift layer 2 can be effectively suppressed without causing extreme electric field concentration. Therefore, excessive electric field concentration on the gate insulating film 10 in the trench 6 in an off-state can be more reliably suppressed. Thereby, high reliability can be more reliably ensured.

The width in the in-plane direction of the second low-resistance layer 9 is 0.1 μm or more. Thereby, depletion in the drift layer 2 can be effectively suppressed without causing extreme electric field concentration. Therefore, excessive electric field concentration on the gate insulating film 10 in the trench 6 in an off-state can be more reliably suppressed. Thereby, high reliability can be more reliably ensured.

Since the protective layer 7 is short-circuited to the source electrode 12, the depletion layer easily extends from the protective layer 7 when a high voltage is applied in an off-state. Thereby, the effect that the protective layer 7 relaxes the electric field to be applied to the gate insulating film 10 can be enhanced.

Additionally, since the protective layer 7 is short-circuited to the source electrode 12, the contribution of the protective layer 7 to the capacitance between the gate and the drain, that is, the feedback capacitance, disappears. Thereby, the feedback capacitance is reduced. Therefore, switching speed can be improved.

Additionally, since the protective layer 7 is short-circuited to the source electrode 12, a voltage drop, which may occur due to a displacement current induced in the protective layer 7 by a change in the drain voltage, is suppressed. Thereby, the electric field to be applied to the gate insulating film 10 due to the voltage drop can be suppressed. Therefore, the reliability of the gate insulating film 10 can be more reliably ensured, and the breakdown resistance, occurring when the drain and the source are short-circuited, can be particularly improved.

When the first low-resistance layer 8 and the second low-resistance layer 9 are formed by epitaxial growth, the first low-resistance layer 8 and the second low-resistance layer 9 can be formed over a wider range than the case of ion implantation.

(Relationship Between Adjacent Cells)

Figure 16:
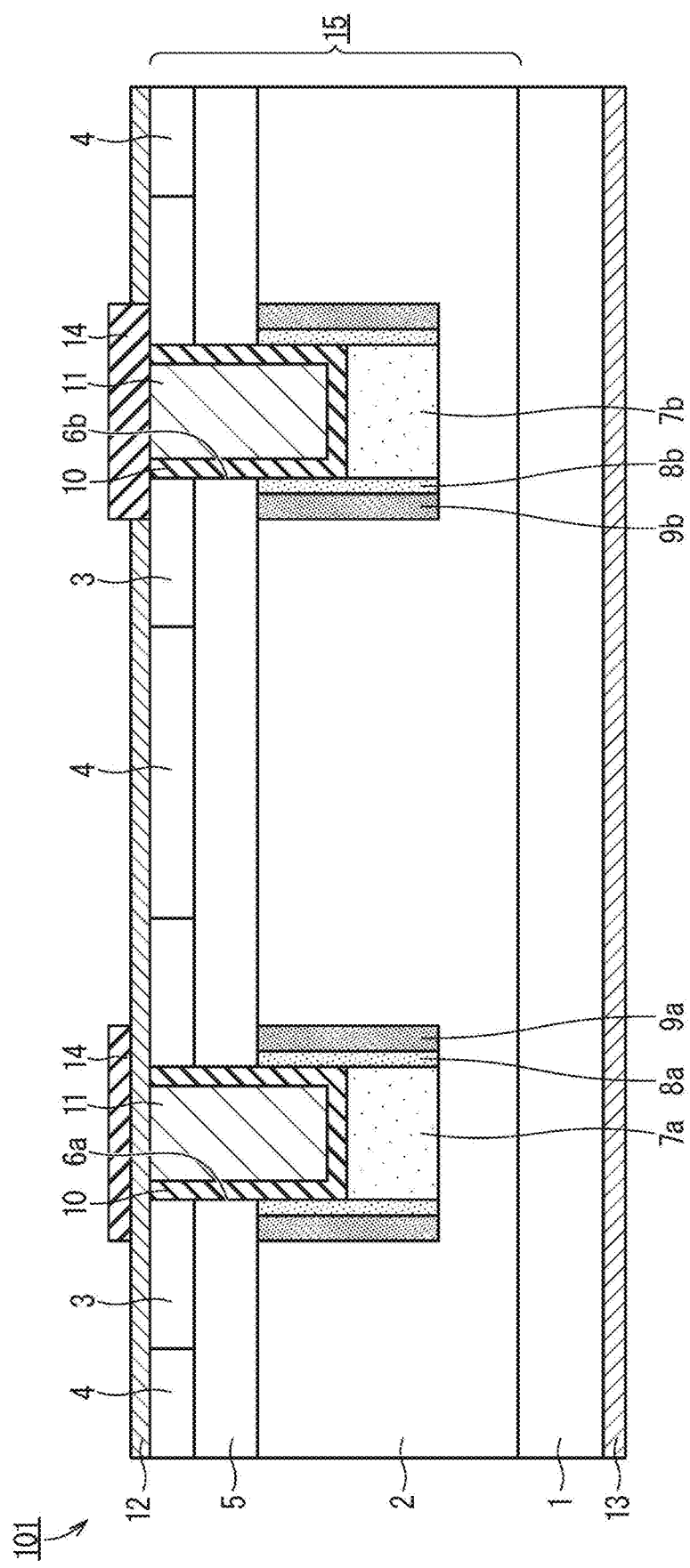
FIG. 16 is a partial cross-sectional view schematically illustrating a structure of a pair of adjacent cells of the silicon carbide semiconductor device of FIG. 1.

In the above description, the configuration of a single cell of the MOSFET 101 has been described in detail by focusing on the cell, as illustrated in FIG. 1. Next, the configuration of the MOSFET 101 will be described in consideration of the relationship between adjacent cells. FIG. 16 is a partial cross-sectional view schematically illustrating a structure of a pair of adjacent cells of MOSFET 101. In sectional view of FIG. 16, the MOSFET 101 includes a pair of adjacent trenches 6a and 6b, a pair of first low-resistance layers 8a and 8b, and a pair of second low-resistance layers 9a and 9b, the second and third pairs corresponding to the first pair. The side surface of the second low-resistance layer 9a and the side surface of the second low-resistance layer 9b are separated by the drift layer 2.

With the above configuration, the drift layer 2 is arranged in the region near the center between the trench 6a and the trench 6b below the body region 5, instead of the second low-resistance layers 9a and 9b. Since this region has a relatively low on-current density, the influence by the impurity concentration of this region on the on-resistance is relatively small. Further, since this region is constituted by the drift layer 2 that is a layer having a relatively low impurity concentration, it becomes difficult for an electric field to enter the upper portion of the trench 6 in an off-state. This suppresses a decrease in reliability due to the electric field. From the above, reliability can be further enhanced while a large increase in the on-resistance is being avoided.

Figure 17:
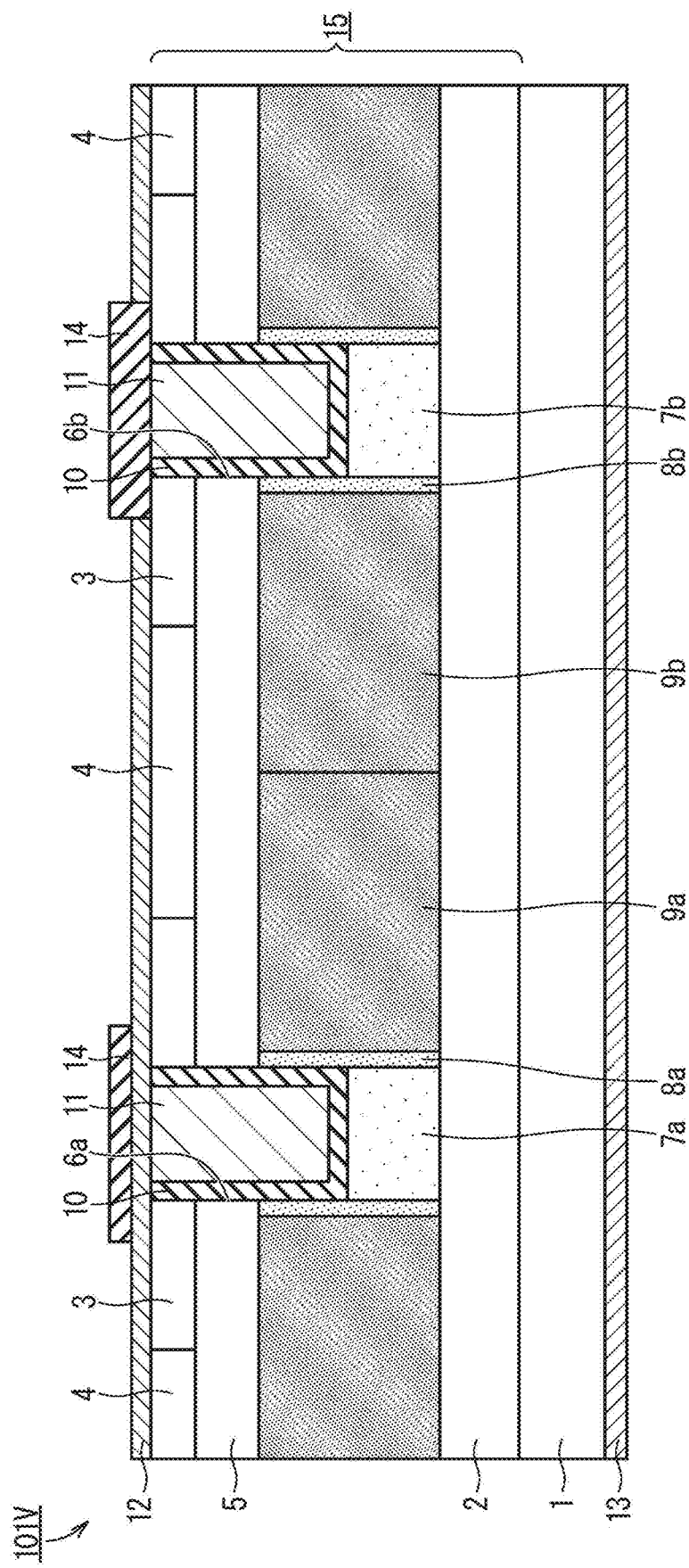
FIG. 17 is a partial cross-sectional view schematically illustrating a structure of a pair of adjacent cells of the silicon carbide semiconductor device, the structure being a modification of FIG. 16.

FIG. 17 is a partial cross-sectional view schematically illustrating a structure of a pair of adjacent cells of a MOSFET 101V that is a modification of the MOSFET 101 (FIG. 16). In sectional view of FIG. 17, the MOSFET 101V includes a pair of adjacent trenches 6a and 6b, a pair of first low-resistance layers 8a and 8b, and a pair of second low-resistance layers 9a and 9b, the second and third pairs corresponding to the first pair. The side surface of the second low-resistance layer 9a and the side surface of the second low-resistance layer 9b are in contact with each other. In the view, all of the side surface of the second low-resistance layer 9a and all of the side surface of the second low-resistance layer 9b are in contact with each other, but part of the side surface of the second low-resistance layer 9a and part of the side surface of the second low-resistance layer 9b may be in contact with each other.

According to the present modification, the second low-resistance layers 9a and 9b having a higher impurity concentration than the drift layer 2 are provided over a wide range below the body region 5 between the adjacent trenches 6a and 6b. Therefore, the JFET resistance can be more effectively reduced. Therefore, the on-resistance can be further reduced.

Second Embodiment (Configuration and Manufacturing Method)

FIG. 18 is a partial cross-sectional view schematically illustrating a structure of a cell of a MOSFET 102 (silicon carbide semiconductor device) according to a second embodiment. The differences between the MOSFET 102 and the MOSFET 101 (FIG. 1: first embodiment) are the configurations of a first low-resistance layer 8 and a second low-resistance layer 9 and methods of forming them, and hence the differences will be mainly described below.

As the structural differences, the second low-resistance layer 9 is in contact with the bottom surface of the first low-resistance layer 8 in the MOSFET 102. The second low-resistance layer 9 is in contact with the protective layer 7.

Figure 19:
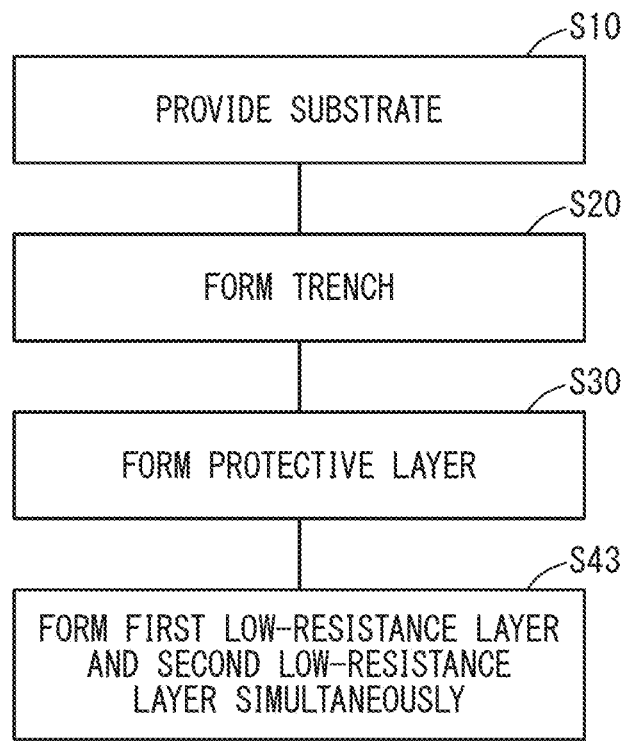
FIG. 19 is a flowchart schematically illustrating a manufacturing method of the silicon carbide semiconductor device of FIG. 18.
Figure 20:
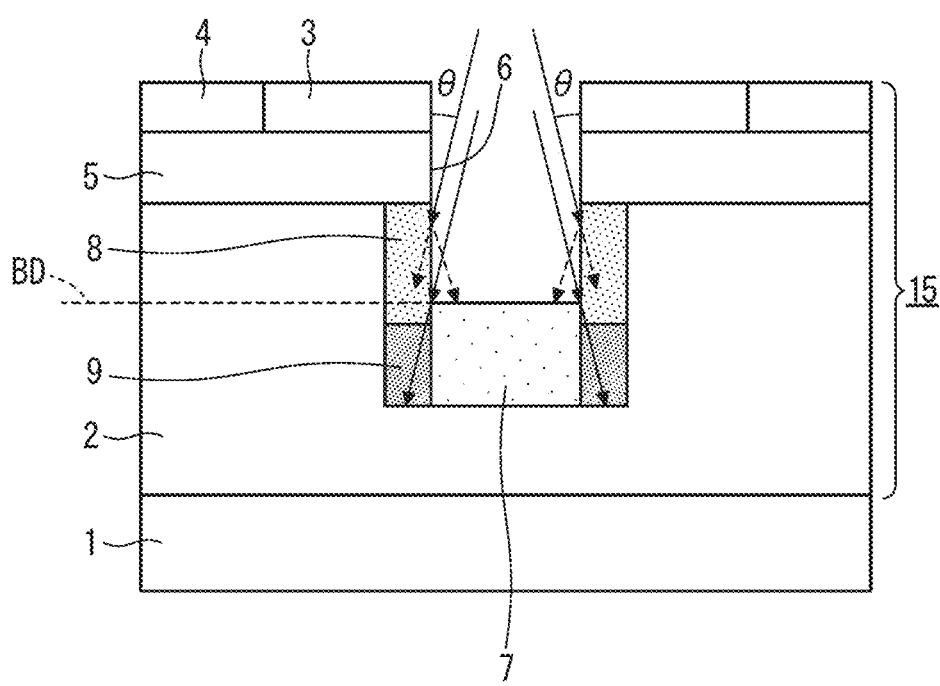
FIG. 20 is a partial cross-sectional view schematically illustrating one step of the manufacturing method of the silicon carbide semiconductor device of FIG. 18.

FIG. 19 is a flowchart schematically illustrating a manufacturing method of the MOSFET 102. Steps up to a step S30 (FIG. 19) (see FIG. 6) are the same as in the first embodiment. FIG. 20 is a partial cross-sectional view schematically illustrating the step of a step S43 (FIG. 19). In the step S43, ion implantation at an inclined angle with respect to the side surface of the trench 6 is performed by selecting an implantation energy such that the concentration peak of the implanted ions is away from the trench 6. Thereby, the first low-resistance layer 8 and the second low-resistance layer 9 are formed simultaneously. As also described in the first embodiment, the first low-resistance layer 8 is in contact with the trench 6 and the protective layer 7, straddles the border BD between the trench 6 and the protective layer 7 in the depth direction, has the first conductivity type, and has a higher impurity concentration than the drift layer 2. The second low-resistance layer 9 is in contact with the first low-resistance layer 8, is away from the trench 6, has the first conductivity type, and has a higher impurity concentration than the first low-resistance layer 8. It is preferable that at least part of the ion implantation be performed at an inclined angle $\theta$ of 30 degrees or less. Hereinafter, the step S43 will be described in more detail.

With the mask 16 (FIG. 6) formed before, or after the mask 16 is removed, ions are implanted into the side surface and the lower portion of the trench 6. This step is performed as inclined ion implantation into the inner wall of the trench 6, as illustrated in FIG. 20. At this time, some of the ions are reflected on the side surface by making an implantation angle $\theta$ with respect to the side surface of the trench 6 small. Due to the influence of the reflection, the total amount of ions implanted into the side surface portion and its vicinity becomes smaller. As a result, the first low-resistance layer 8 is formed in the portion. On the other hand, the total amount of ions implanted into a portion deeper than the bottom surface of the trench 6 becomes larger due to the small influence of the reflection. As a result, the second low-resistance layer 9 having a higher impurity concentration than the first low-resistance layer 8 is formed in the portion.

Figure 21:
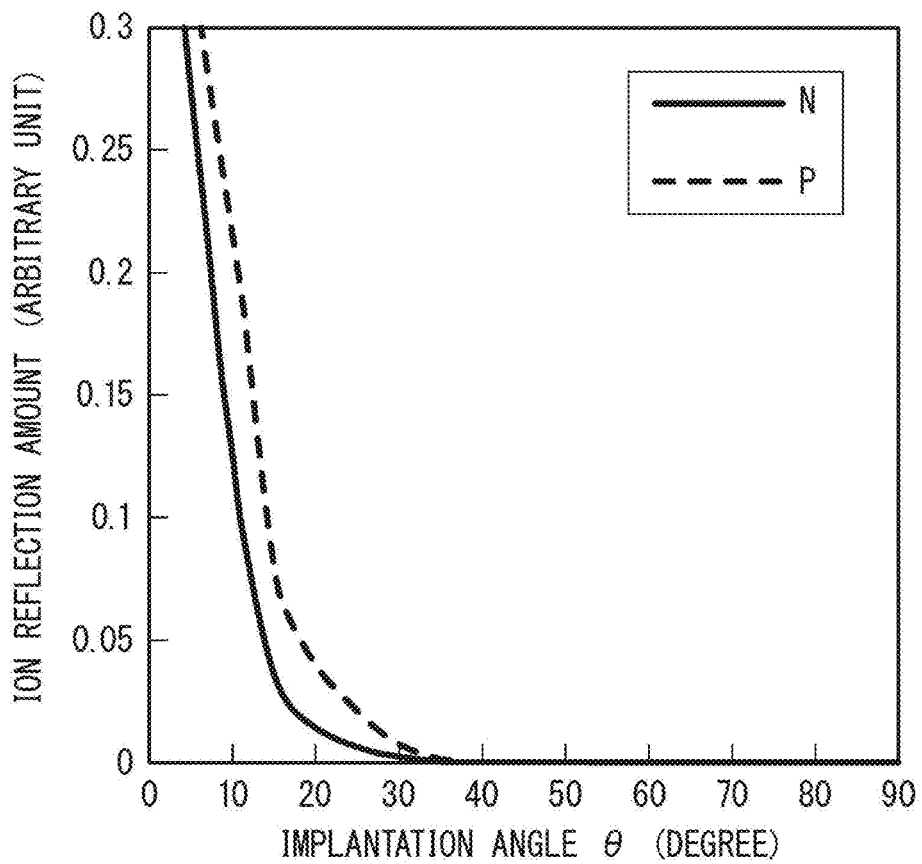
FIG. 21 is a graph showing a relationship between an ion reflection amount from an implantation surface and an implantation angle of an ion implantation beam.

FIG. 21 is a graph showing a relationship between an ion reflection amount from an implantation surface and an implantation angle of an ion implantation beam. The implantation angle $\theta$ is defined such that an angle perpendicular to the implantation plane is 90 degrees and an angle parallel to the implantation plane is 0 degrees. In this graph, N ions and P ions are shown as examples, but the ion species are not limited thereto. When the implantation angle $\theta$ is 30 degrees or less, a significant reflection amount is observed. On the other hand, when the implantation angle $\theta$ is more than 30 degrees, the reflection amount becomes dramatically small. Therefore, ions can be effectively reflected from the side surfaces of the trench 6 by implanting ions at a small implantation angle $\theta$ of about 30 degrees or less with respect to the side surfaces of the trench 6. Thereby, ions can be implanted into a position deeper than the trench 6 at a relatively high concentration. By the inclined ion implantation utilizing this phenomenon, the low-concentration first low-resistance layer 8 near the side surface of the trench 6 and the high-concentration second low-resistance layer 9 near the bottom surface of the trench 6 can be formed simultaneously. The second low-resistance layer 9 is formed to contact the bottom of the first low-resistance layer 8. The number of times of the above-described inclined ion implantation may be one or more.

<Effects>

With the MOSFET 102, substantially the same effects as in the first embodiment can also be obtained.

Further, the side surface of the protective layer 7 is in contact with the second low-resistance layer 9 having a high impurity concentration in the MOSFET 102. Therefore, the effect of suppressing the extension of the depletion layer from the side surface of the protective layer 7, which may occur when the device is turned on, is high. Therefore, the JFET resistance between the adjacent protective layers 7 can be significantly reduced. A reduction in the JFET resistance and a subsequently obtained reduction in cell pitch can reduce the on-resistance of the device.

The manufacturing method of the MOSFET 101 can be simplified by collectively forming the first low-resistance layer 8 and the second low-resistance layer 9. The reflection amount of ions particularly on the side surface of the trench 6 among the inner walls thereof becomes large particularly by setting the inclined angle θ to 30 degrees or less. Thereby, the first low-resistance layer 8 that is to be arranged near the side surface of the trench 6 and has a relatively low impurity concentration, and the second low-resistance layer 9 that is to be arranged below the trench 6 and has a relatively high impurity concentration, can be formed simultaneously while a sufficient impurity concentration difference is being ensured.

Modification of Second Embodiment

The first low-resistance layer 8 and the second low-resistance layer 9 may be formed by vertical ion implantation into the surface of the semiconductor layer 15 or by epitaxial growth. For example, after the drift layer 2 is formed according to the manufacturing method of the first embodiment, as illustrated in FIG. 3, the second low-resistance layer 9 is formed by ion implantation or epitaxial growth. The first low-resistance layer 8 is formed thereon by ion implantation or epitaxial growth. In this ion implantation or epitaxial growth, the first low-resistance layer 8 and the second low-resistance layer 9 may be formed locally by using a mask partially having an opening. Thereafter, the body region 5, the source region 3, and the body contact region 4 are formed by the same method as in the first embodiment. Then, the trench 6 is formed to contact the side surface of the first low-resistance layer 8, and the protective layer 7 is formed to contact part of the side surface of the first low-resistance layer 8 and the side surface of the second low-resistance layer 9. Thereby, the MOSFET 102 (FIG. 18) is obtained.

When the cell structure illustrated in FIG. 18 is repeated, a pair of the first low-resistance layers 8 provided in each of a pair of adjacent cells are separated by the drift layer 2. Also, a pair of the second low-resistance layers 9 provided in each of a pair of adjacent cells are separated by the drift layer 2.

Here, a pair of the second low-resistance layers 9 that are in contact with each other may be provided between a pair of adjacent cells, similarly to the modification (FIG. 17) of the first embodiment. Alternatively, in addition to or instead of that, a pair of the first low-resistance layers 8 that are in contact with each other may be provided between a pair of adjacent cells in the present embodiment.

Alternatively, the second low-resistance layer 9 may be formed below the protective layer 7.

Third Embodiment (Configuration)

Figure 22:
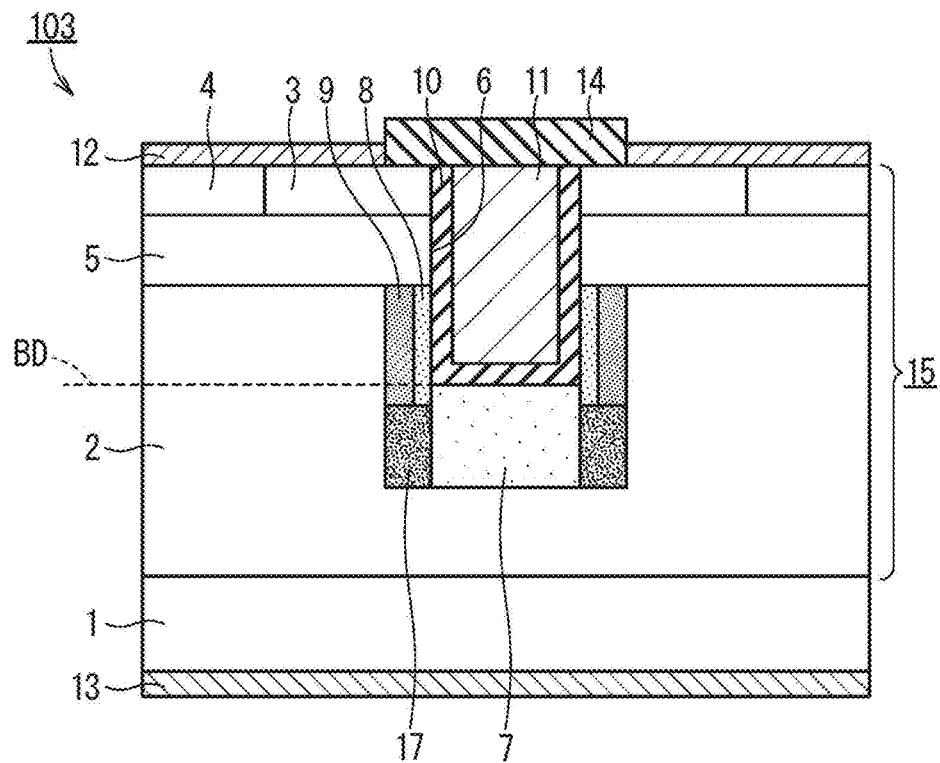
FIG. 22 is a partial cross-sectional view schematically illustrating a structure of a cell of a silicon carbide semiconductor device according to a third embodiment of the present invention.

FIG. 22 is a partial cross-sectional view schematically illustrating a structure of a cell of a MOSFET 103 (silicon carbide semiconductor device) according to a third embodiment. The differences between the MOSFET 103 and the MOSFET 101 (FIG. 1: first embodiment) are: the configurations of a first low-resistance layer 8 and a second low-resistance layer 9 and methods of forming them; and the fact that a third low-resistance layer 17 is formed, and hence the differences will be mainly described below.

Also in the MOSFET 103, the first low-resistance layer 8 covers the side surface of the trench 6 below the body region 5, similarly to the MOSFET 101. The second low-resistance layer 9 is formed to contact the side surface of the first low-resistance layer 8.

In the MOSFET 103, the third low-resistance layer 17 is further provided as part of the semiconductor layer 15 in addition to the first low-resistance layer 8 and the second low-resistance layer 9. The third low-resistance layer 17 is in contact with: the bottom surface of the first low-resistance layer 8; the bottom surface of the second low-resistance layer 9; and the side surface of the protective layer 7. The third low-resistance layer 17 has the first conductivity type and has a higher impurity concentration than the first low-resistance layer 8.

When the cell structure illustrated in FIG. 22 is repeated, a pair of the third low-resistance layers 17 provided in each of a pair of adjacent cells are separated by the drift layer 2. As a modification, a pair of the third low-resistance layers 17 that are in contact with each other may be provided between a pair of adjacent cells. Alternatively, the third low-resistance layer 17 may be formed below the protective layer 7.

(Manufacturing Method)

Next, a manufacturing method of the MOSFET 103 will be described below.

First, impurities are implanted into the inner wall of the trench 6 by one or more times of inclined ion implantation in which an impurity concentration becomes higher as more away from the side surface of the trench 6, according to a manufacturing method substantially similar to that of the first embodiment. Thereby, the first low-resistance layer 8 and the second low-resistance layer 9 are formed.

Next, impurities are implanted, at a high concentration, into a position somewhat deeper than the trench 6 by performing ion implantation at a small angle (e.g., an angle of 30 degrees or less) with respect to the side surface of the trench 6, as described in the manufacturing method of the second embodiment. Thereby, the third low-resistance layer 17 is formed. The impurity concentration of the third low-resistance layer 17 may be equal to or higher than that of the second low-resistance layer 9. One or both of the first low-resistance layer 8 and the second low-resistance layer 9 may be formed simultaneously with the third low-resistance layer 17 by the above-described ion implantation at a small angle with respect to the side surface of the trench 6. The first low-resistance layer 8, the second low-resistance layer 9, and the third low-resistance layer 17 can be formed simultaneously by selecting an implantation energy and an ion dose such that an impurity concentration peak is formed at a position away from the side surface of the trench 6 and the tail of the impurity concentration profile contacts the side surface of the trench 6.

The third low-resistance layer 17 may be formed by vertical ion implantation into the surface of the semiconductor layer 15 or by epitaxial growth in the drift layer 2. Thereafter, the body region 5, the source region 3, the body contact region 4, the trench 6, the first low-resistance layer 8, and the second low-resistance layer 9 are formed by the same method as in the first embodiment. Alternatively, the first low-resistance layer 8 and the second low-resistance layer 9 may be formed by epitaxial growth in the drift layer 2.

<Effects>

According to the present embodiment, substantially the same effects as in the first embodiment can also be obtained.

Further, according to the present embodiment, the side surface and the bottom surface of the first low-resistance layer 8 having a relatively low impurity concentration are covered with the second low-resistance layer 9 and the third low-resistance layer 17 both having a relatively high impurity concentration, respectively. Thereby, the JFET resistance can be more effectively reduced. Therefore, the on-resistance can be further reduced.

The side surface of the protective layer 7 is in contact with the third low-resistance layer 17 having a high impurity concentration. Therefore, the effect of suppressing the extension of the depletion layer from the side surface of the protective layer 7, which may occur when the device is turned on, is high. Therefore, the JFET resistance between the adjacent protective layers 7 can be significantly reduced. A reduction in the JFET resistance and a subsequently obtained reduction in cell pitch can reduce the on-resistance of the device.

Further, both the second low-resistance layer 9 and the third low-resistance layer 17 both having a high impurity concentration are formed in two types of regions including a region between the body region 5 and the protective layer 7 and a region between a pair of the protective layers 7 that are adjacent to each other via the drift layer 2. Thereby, the JFET resistance in each of the regions is significantly reduced, so that the on-resistance can be effectively reduced. Thereby, a trade-off between on-resistance and breakdown voltage can be greatly improved.

Fourth Embodiment (Configuration)

Figure 23:
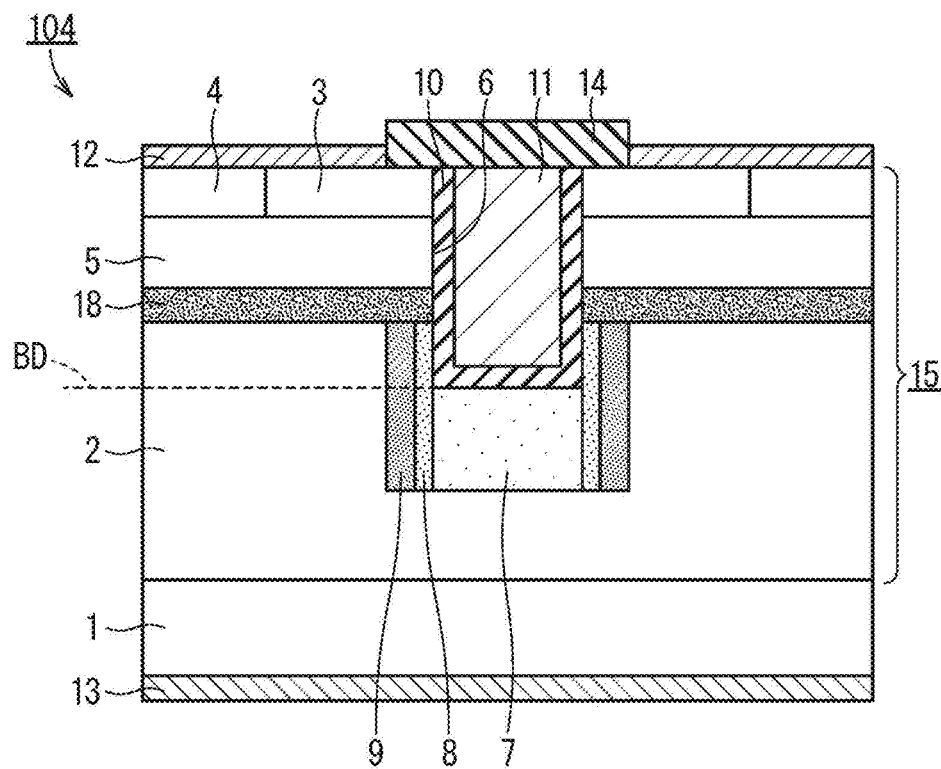
FIG. 23 is a partial cross-sectional view schematically illustrating a structure of a cell of a silicon carbide semiconductor device according to a fourth embodiment of the present invention.

FIG. 23 is a partial cross-sectional view schematically illustrating a structure of a cell of a MOSFET 104 (silicon carbide semiconductor device) according to a fourth embodiment. The difference between the MOSFET 104 and the MOSFET 101 (FIG. 1: first embodiment) is that a current diffusion layer 18 is formed, and hence the differences will be mainly described below.

The MOSFET 104 has the current diffusion layer 18 as part of the semiconductor layer 15. The current diffusion layer 18 is provided between the lower portion of the body region 5 and the drift layer 2, and has a lower end located shallower than the upper end of the protective layer 7. The current diffusion layer 18 has the first conductivity type, and has a higher impurity concentration than the second low-resistance layer 9. The second low-resistance layer 9 is formed to contact the bottom surface or the side surface of the current diffusion layer 18.

(Manufacturing Method)

Figure 24:
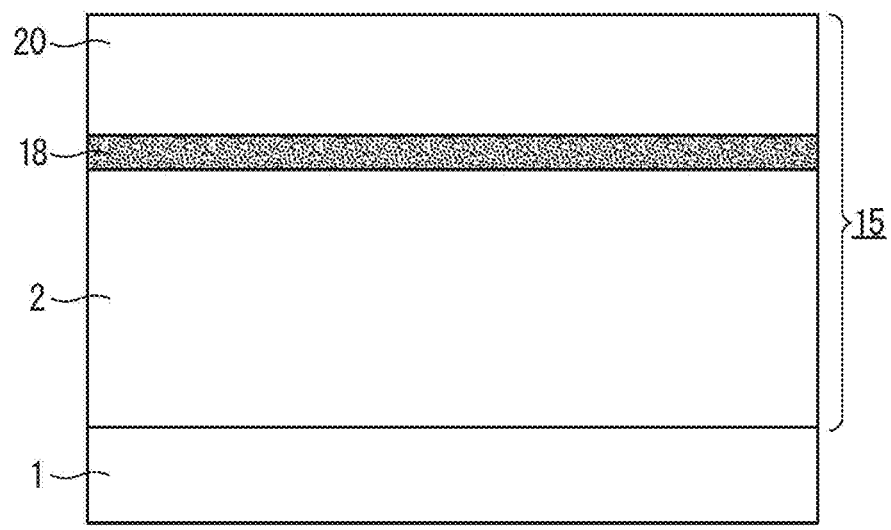
FIG. 24 is a partial cross-sectional view schematically illustrating one step of a manufacturing method of the silicon carbide semiconductor device of FIG. 23.

FIG. 24 is a partial cross-sectional view schematically illustrating one step of a manufacturing method of the MOSFET 104. First, the drift layer 2 is formed according to a manufacturing method substantially similar to that of the first embodiment. Thereafter, the current diffusion layer 18 of the first conductivity type is formed on the drift layer 2 by ion implantation or epitaxial growth. At this time, the current diffusion layer 18 may be formed widely over the entire surface of the drift layer 2. Alternatively, the current diffusion layer 18 may be formed in a predetermined pattern on the drift layer 2 by using a mask having an opening. This pattern may have a local region, or have a region surrounding the drift layer 2. Specifically, the current diffusion layer 18 may be formed in a region other than a specific region such as the central region or the outer peripheral region of a semiconductor chip as the MOSFET 104. The drift layer 2 may be interposed between the side surface of the trench 6 and the current diffusion layer 18. Alternatively, the current diffusion layer 18 may be formed to sandwich the drift layer 2 in the in-plane direction at a position away from the trench 6.

With reference to FIG. 23 again, the body region 5 is subsequently formed on the current diffusion layer 18. Thereafter, the source region 3 and the body contact region 4 are formed. Then, the trench 6 is formed to penetrate the body region 5. Then, the protective layer 7 is formed below the trench 6. Then, the first low-resistance layer 8 and the second low-resistance layer 9 are formed in the same way as in the first embodiment. Thus, the MOSFET 104 can be obtained.

In the present fourth embodiment, the configuration, in which the current diffusion layer 18 is added to the configuration of the first embodiment, has been described in detail, however, the current diffusion layer may be added to the configurations of the second to third embodiments.

<Effects>

According to the present embodiment, the extension of the depletion layer extending from body region 5, which may occur when the device is turned on, is suppressed over a wide range by the current diffusion layer 18. Thereby, the JFET resistance between the body region 5 and the protective layer 7 is significantly reduced. Therefore, the necessity for the impurity concentrations of the first low-resistance layer 8 and the second low-resistance layer 9 in order to reduce the JFET resistance, particularly for the impurity concentration of the first low-resistance layer 8 in contact with the lower portion of the trench 6 to increase, can be suppressed to some extent. Therefore, excessive electric field concentration on the gate insulating film 10 adjacent to the first low-resistance layer 8 and the second low-resistance layer 9 can be further suppressed.

On the other hand, the extension in the in-plane direction (horizontal direction in FIG. 23) of the depletion layer from the side surface of the protective layer 7 is suppressed by the second low-resistance layer 9 having a high impurity concentration. Thereby, the JFET resistance between the protective layers 7 adjacent to each other via the drift layer 2 can be suppressed. Therefore, the cell pitch can also be reduced, and the on-resistance can be further reduced.

As described above, a region having a high concentration of impurities of the first conductivity type is formed between the body region 5 and the protective layer 7 and between the adjacent protective layers 7, where the JFET resistance may become large, and hence the effect of reducing the JFET resistance is remarkably high, and a trade-off between on-resistance and breakdown voltage can be remarkably improved.

Fifth Embodiment

FIG. 25 is a partial cross-sectional view schematically illustrating a structure of a cell of a MOSFET 105 (silicon carbide semiconductor device) according to a fifth embodiment. Also in the fifth embodiment, the protective layer 7 is arranged below the trench 6, similarly to the first embodiment (FIG. 1). In the MOSFET 101 (FIG. 1: first embodiment), the upper end of the protective layer 7 is in contact with the lower end of the trench 6, however, in the MOSFET 105, they are away from each other via the drift layer 2. Therefore, in the present embodiment, the border BD means a region between the upper end of the protective layer 7 and the lower end of the trench 6 in the depth direction. In other words, the border BD has a spread in the depth direction. The first low-resistance layer 8 straddles this border BD in the depth direction.

Configurations other than the above are substantially the same as those of the above-described first embodiment, and hence the same or corresponding elements are denoted by the same reference signs and description thereof will not be repeated. Additionally, not only in the first embodiment but also in the second to fourth embodiments, the border BD may have a spread in the depth direction, as described above.

In the present invention, each embodiment can be freely combined or appropriately modified or omitted within the scope of the present invention. Although the present invention has been described in detail, the above description is shown as an example in all aspects and the present invention is not limited thereto. It is to be understood that countless modifications that are not shown as examples can be conceived of without departing from the scope of the present invention.

EXPLANATION OF REFERENCE SIGNS

BD: border
1: substrate (semiconductor substrate)
2: drift layer
3: source region
4: body contact region
5: body region
6, 6a, 6b: trench
7: protective layer
8, 8a, 8b: first low-resistance layer
9, 9a, 9b: second low-resistance layer
10: gate insulating film
11: gate electrode
12: source electrode
13: drain electrode
14: interlayer insulating film
15: semiconductor layer
16: mask
17: third low-resistance layer
18: current diffusion layer
101, 101V, 102 to 105: MOSFET (silicon carbide semiconductor device)

The invention claimed is:

1. A silicon carbide semiconductor device comprising:
a drift layer being made of silicon carbide and having a first conductivity type;
a body region provided on the drift layer and having a second conductivity type;
a source region provided on the body region and having the first conductivity type;
a gate insulating film provided on each inner wall of at least one trench penetrating the source region and the body region;
a gate electrode provided in each of the at least one trench via the gate insulating film;
at least one protective layer having a portion located below the trench, being in contact with the drift layer, and having the second conductivity type;
at least one first low-resistance layer being in contact with the trench and the protective layer, straddling a border between the trench and the protective layer in a depth direction, having the first conductivity type, and having a higher impurity concentration than the drift layer; and
at least one second low-resistance layer being in contact with the first low-resistance layer, being away from the trench, having the first conductivity type, and having a higher impurity concentration than the first low-resistance layer.

2. The silicon carbide semiconductor device according to claim 1, wherein the impurity concentration of the first low-resistance layer becomes higher as more away from the trench.

3. The silicon carbide semiconductor device according to claim 1, wherein the second low-resistance layer is in contact with a bottom surface of the first low-resistance layer.

4. The silicon carbide semiconductor device according to claim 1, wherein
the second low-resistance layer is in contact with a side surface of the first low-resistance layer, and
the silicon carbide semiconductor device further comprises a third low-resistance layer being in contact with the bottom surface of the first low-resistance layer, a bottom surface of the second low-resistance layer, and a side surface of the protective layer, having the first conductivity type, and having a higher impurity concentration than the first low-resistance layer.

5. The silicon carbide semiconductor device according to claim 1, wherein
in sectional view,
the at least one trench includes a pair of adjacent trenches, corresponding to the pair of trenches, the at least one first low-resistance layer includes a pair of first low-resistance layers, and the at least one second low-resistance layer include a pair of second low-resistance layers, and
a side surface of one of the pair of second low-resistance layers and a side surface of the other of the pair of second low-resistance layers are in contact with each other.

6. The silicon carbide semiconductor device according to claim 1, wherein
in sectional view,
the at least one trench includes a pair of adjacent trenches, corresponding to the pair of trenches, the at least one first low-resistance layer includes a pair of first low-resistance layers, and the at least one second low-resistance layer include a pair of second low-resistance layers, and
a side surface of one of the pair of second low-resistance layers and a side surface of the other of the pair of second low-resistance layers are separated by the drift layer.

7. The silicon carbide semiconductor device according to claim 1, further comprising a current diffusion layer provided between a lower portion of the body region and the drift layer, having a lower end located shallower than an upper end of the protective layer, having the first conductivity type, and having a higher impurity concentration than the second low-resistance layer.

8. The silicon carbide semiconductor device according to claim 1, wherein the concentration of impurities of the first conductivity type of the second low-resistance layer is $3 \times 10^{17}$ cm$^{-3}$ or less.

9. The silicon carbide semiconductor device according to claim 1, wherein a width in an in-plane direction of the first low-resistance layer is 0.1 µm or more.

10. The silicon carbide semiconductor device according to claim 1, wherein a width in an in-plane direction of the second low-resistance layer is 0.1 µm or more.

11. The silicon carbide semiconductor device according to claim 1, further comprising a source electrode electrically connected to the source region, wherein the protective layer is short-circuited to the source electrode.

12. A manufacturing method of a silicon carbide semiconductor device, comprising:

providing a semiconductor substrate provided with a drift layer, the drift layer being made of silicon carbide and having a first conductivity type;

forming a trench in the drift layer;

forming a protective layer by implanting impurities of a second conductivity type into a bottom surface of the trench, the protective layer having at least a portion located below the trench, being in contact with the drift layer, and having the second conductivity type;

forming a first low-resistance layer by first ion implantation at an inclined angle with respect to a side surface of the trench, the first low-resistance layer being in contact with the trench and the protective layer, straddling a border between the trench and the protective layer in a depth direction, having the first conductivity type, and having a higher impurity concentration than the drift layer; and forming a second low-resistance layer by second ion implantation at an inclined angle with respect to the side surface of the trench, the second low-resistance layer being in contact with the first low-resistance layer, being away from the trench, having the first conductivity type, and having a higher impurity concentration than the first low-resistance layer.

13. The manufacturing method of a silicon carbide semiconductor device according to claim 12, wherein the forming of the first low-resistance layer and the forming of the second low-resistance layer are performed simultaneously.

14. The manufacturing method of a silicon carbide semiconductor device according to claim 13, wherein the first ion plantation and the second ion plantation are performed by a common ion plantation, and at least part of the common ion implantation is performed by setting the inclined angle to 30 degrees or less.

15. A manufacturing method of a silicon carbide semiconductor device, the silicon carbide semiconductor device including a drift layer made of silicon carbide and having a first conductivity type, a body region provided on the drift layer and having a second conductivity type, a source region provided on the body region and having the first conductivity type, a gate insulating film provided on each inner wall of at least one trench penetrating the source region and the body region, a gate electrode provided in each of the at least one trench via the gate insulating film, at least one protective layer having at least a portion located below the trench, being in contact with the drift layer, and having the second conductivity type, at least one first low-resistance layer being in contact with the trench and the protective layer, straddling a border between the trench and the protective layer in a depth direction, having the first conductivity type, and having a higher impurity concentration than the drift layer, and at least one second low-resistance layer being in contact with the first low-resistance layer, being away from the trench, having the first conductivity type, and having a higher impurity concentration than the first low-resistance layer, the manufacturing method comprising:

providing a semiconductor substrate provided with at least part of the drift layer; and forming the first low-resistance layer and the second low-resistance layer by epitaxial growth during which impurities are being added in order to obtain a higher impurity concentration than the drift layer.

* * * * *